US012771896B2

(12) United States Patent
Kim et al.

(10) Patent No.: US 12,771,896 B2
(45) Date of Patent: Oct. 20, 2026

(54) CONTROL BOX AND DISPLAY DEVICE COMPRISING SAME

(71) Applicant: LG ELECTRONICS INC., Seoul (KR)

(72) Inventors: Chulki Kim, Seoul (KR); Kwaneun Jin, Seoul (KR); Jonggil Pyo, Seoul (KR); Seunggyu Kang, Seoul (KR); Deugjin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 58 days.

(21) Appl. No.: 19/118,559

(22) PCT Filed: Oct. 5, 2022

(86) PCT No.: PCT/KR2022/015002
§ 371 (c)(1),
(2) Date: Apr. 4, 2025

(87) PCT Pub. No.: WO2024/075867
PCT Pub. Date: Apr. 11, 2024

(65) Prior Publication Data
US 2026/0136060 A1 May 14, 2026

(51) Int. Cl.
*H04N 21/426* (2011.01)
*H05K 7/20* (2006.01)

(52) U.S. Cl.
CPC ......... *H04N 21/426* (2013.01); *H05K 7/2039* (2013.01)

(58) Field of Classification Search
CPC ........................... H04N 21/426; H05K 7/2039
See application file for complete search history.

(56) References Cited

U.S. PATENT DOCUMENTS

2015/0106861 A1 4/2015 Yu
2022/0217855 A1* 7/2022 Lee ........................ G06F 3/147

FOREIGN PATENT DOCUMENTS

KR 10-2012-0092256 A 8/2012
KR 10-1261443 B1 5/2013
KR 10-2020-0052581 A 5/2020
WO WO 2022/149624 A1 7/2022

* cited by examiner

*Primary Examiner* — Michael H Hong
(74) *Attorney, Agent, or Firm* — Birch, Stewart, Kolasch & Birch, LLP

(57) ABSTRACT

A control box and a display device comprising same are disclosed. The control box of the present disclosure may include: a case; a bracket which is disposed inside the case and coupled to the case; and a communication module which is rotatably coupled to the bracket, wherein: the communication module may include an antenna unit, a heat sink to which the antenna unit is mounted and which is elongated, the heat sink overlapping a portion of the bracket in the longitudinal direction of the heat sink, and a connection shaft which extends in the longitudinal direction of the heat sink and which connects the heat sink to the bracket; and the connection shaft may provide an axis of rotation of the communication module.

13 Claims, 34 Drawing Sheets

[FIG. 1]
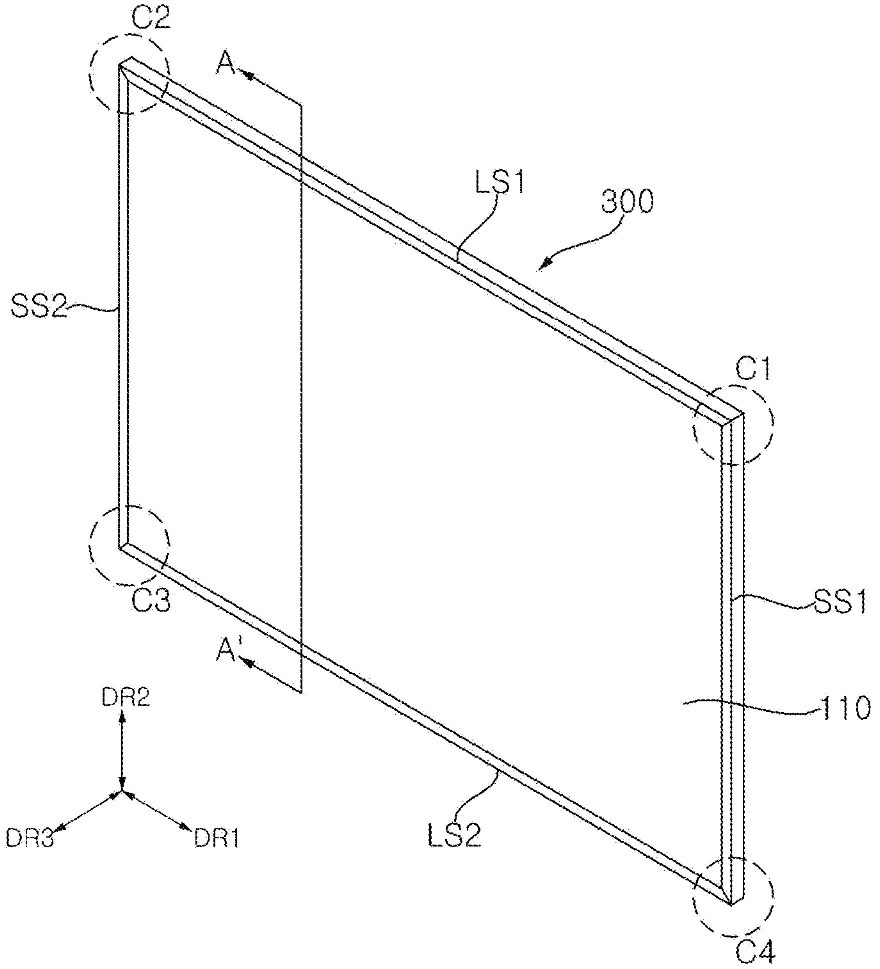

[FIG. 2]
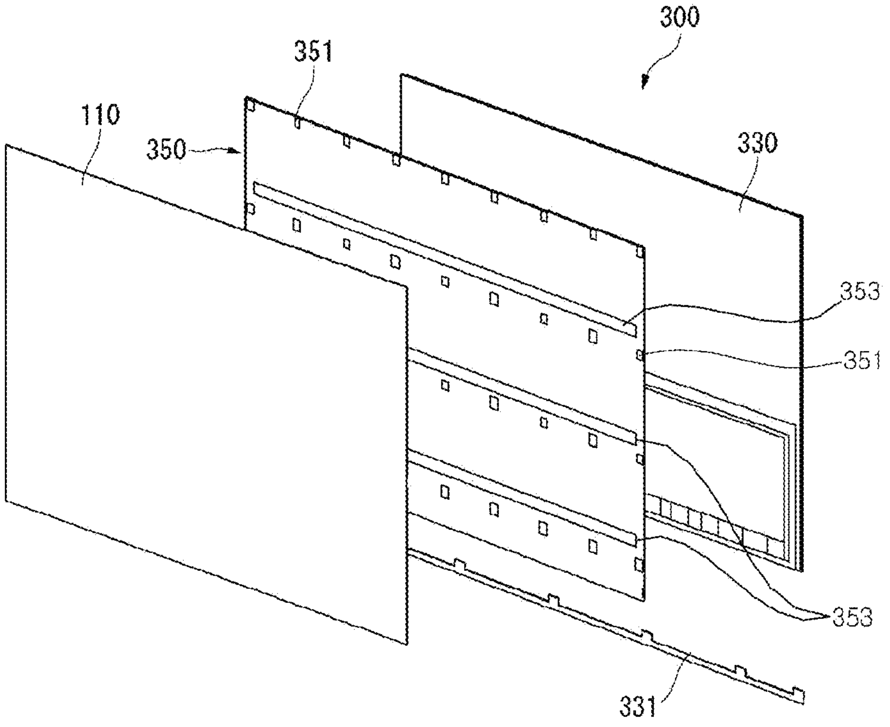

[FIG. 3]
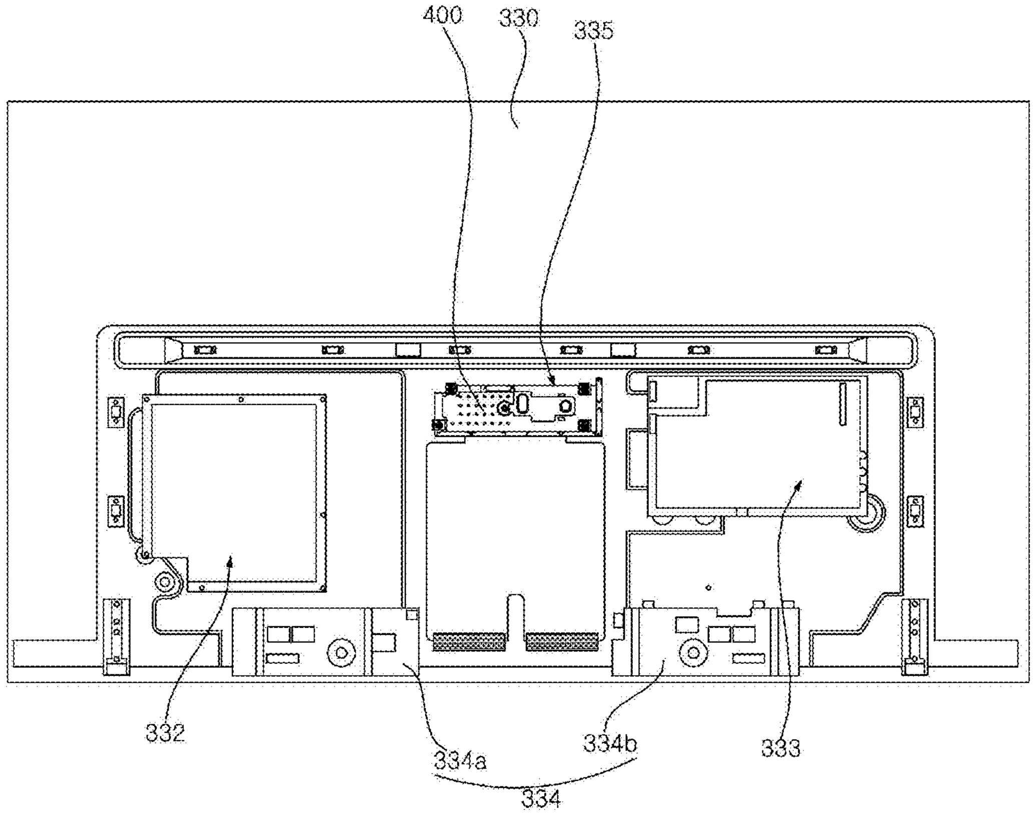

[FIG. 4]
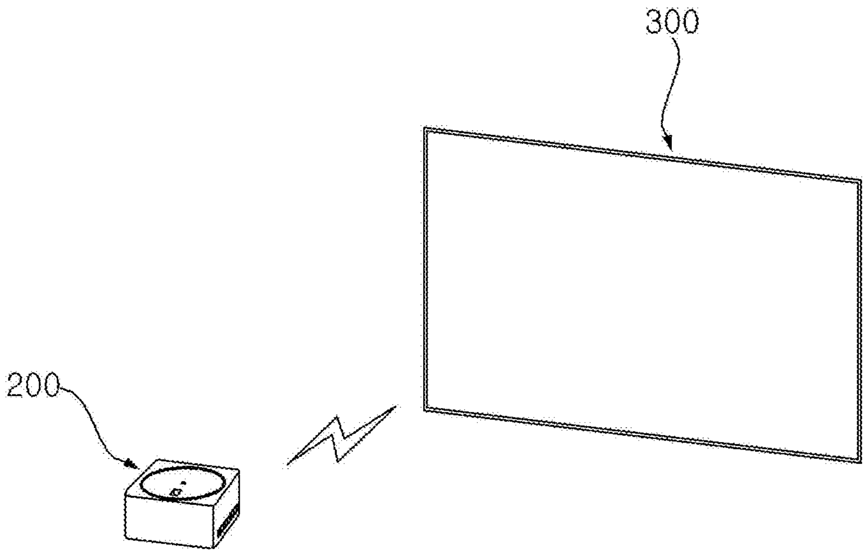

[FIG. 5]
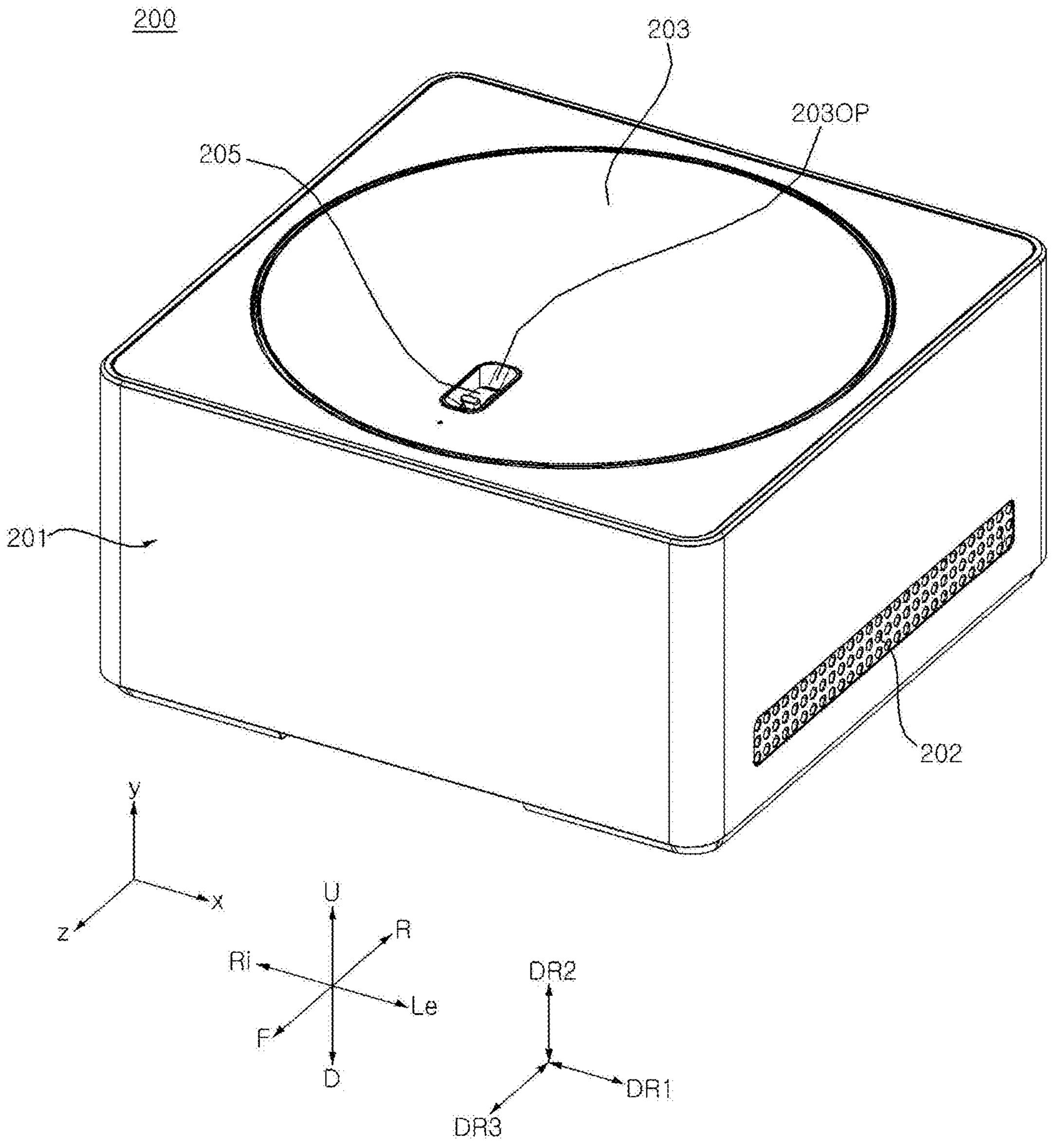

[FIG. 6]
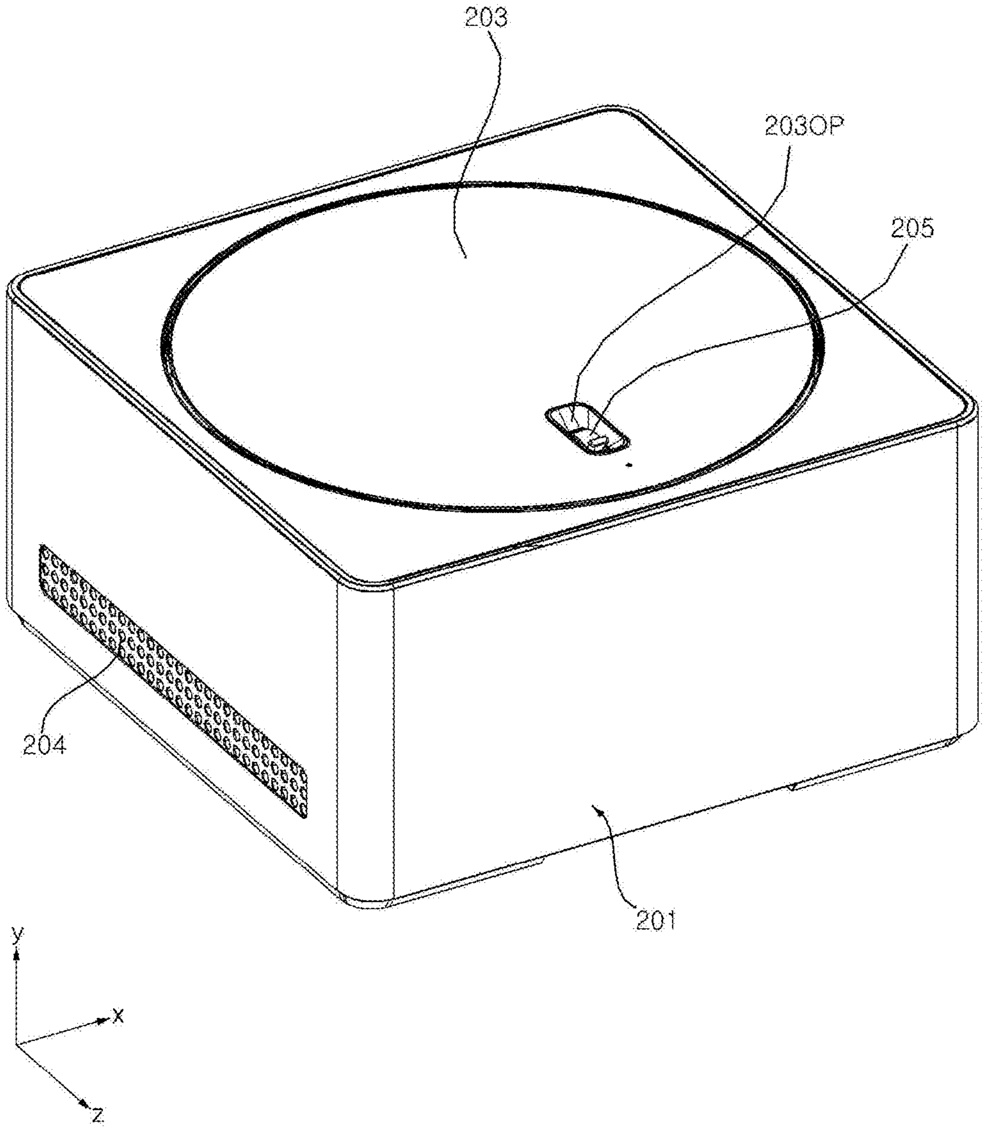

[FIG. 7]
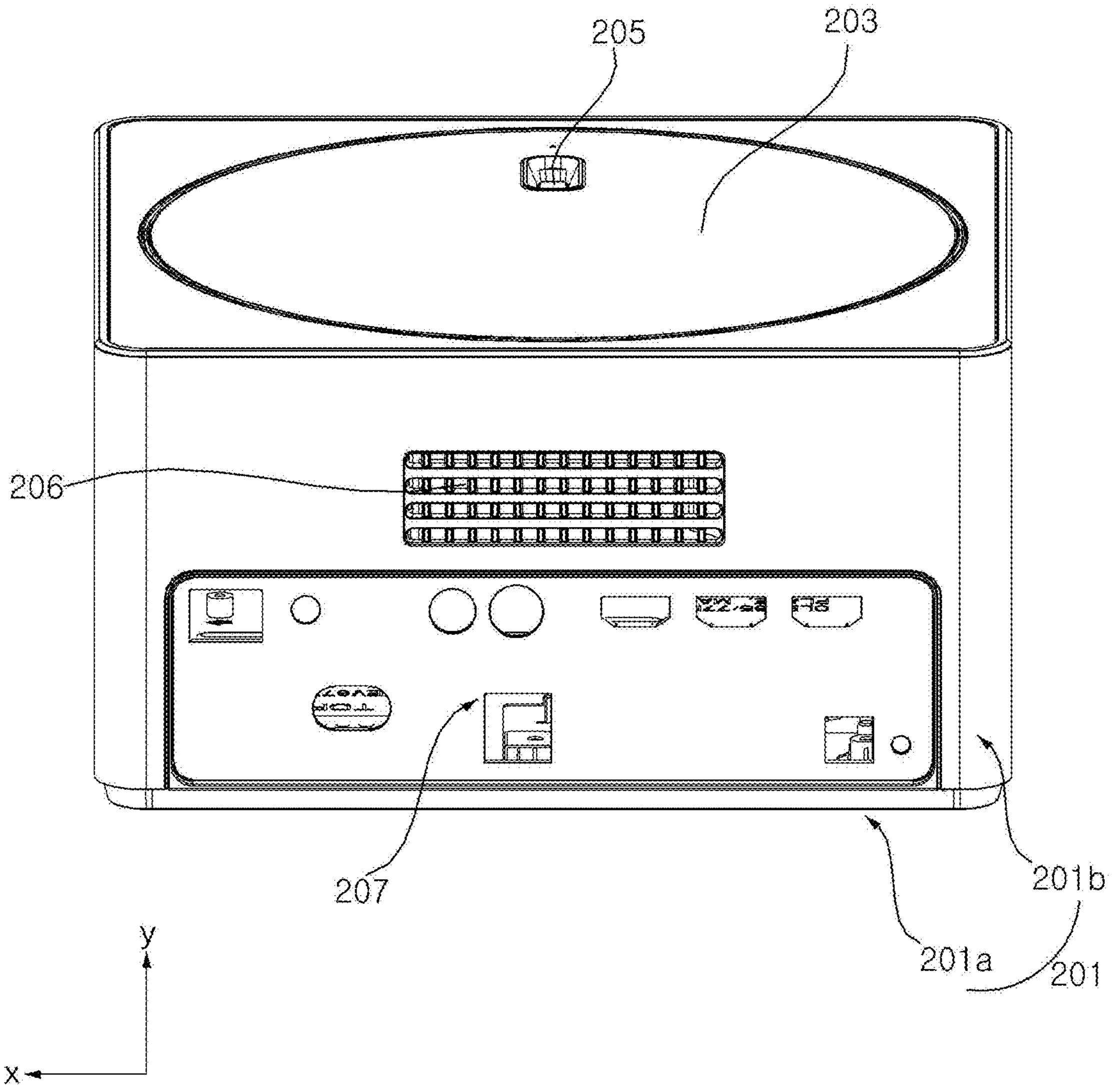

[FIG. 8]
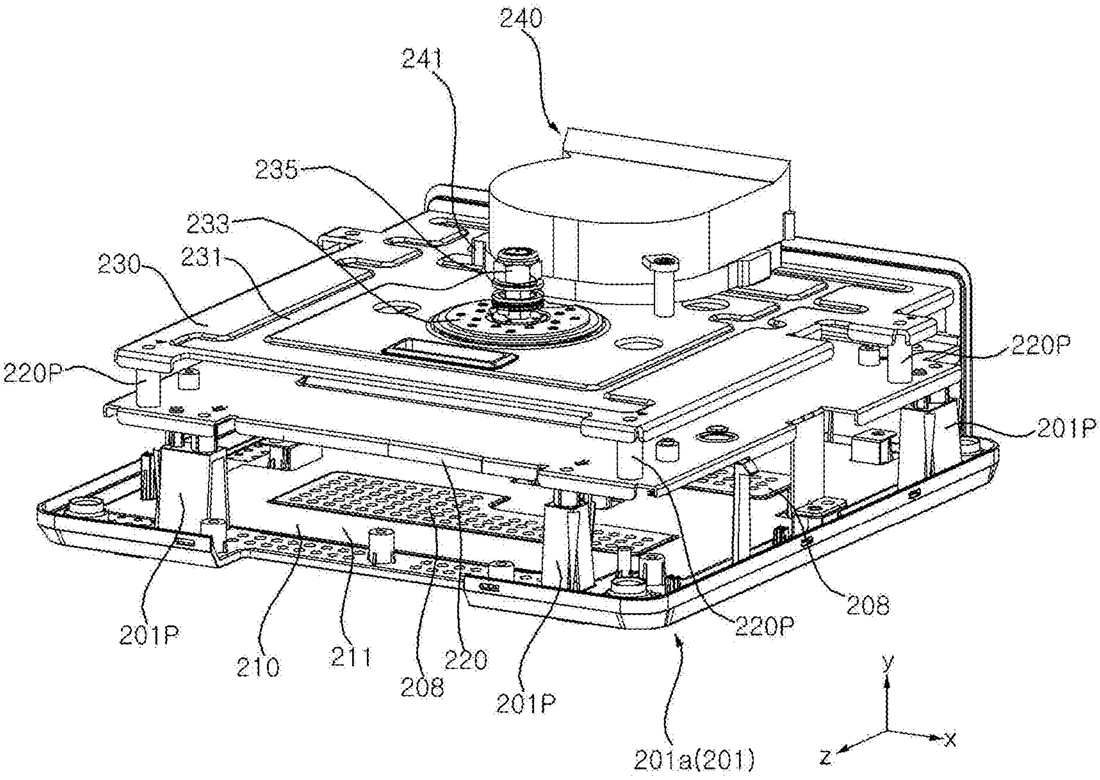

[FIG. 9]
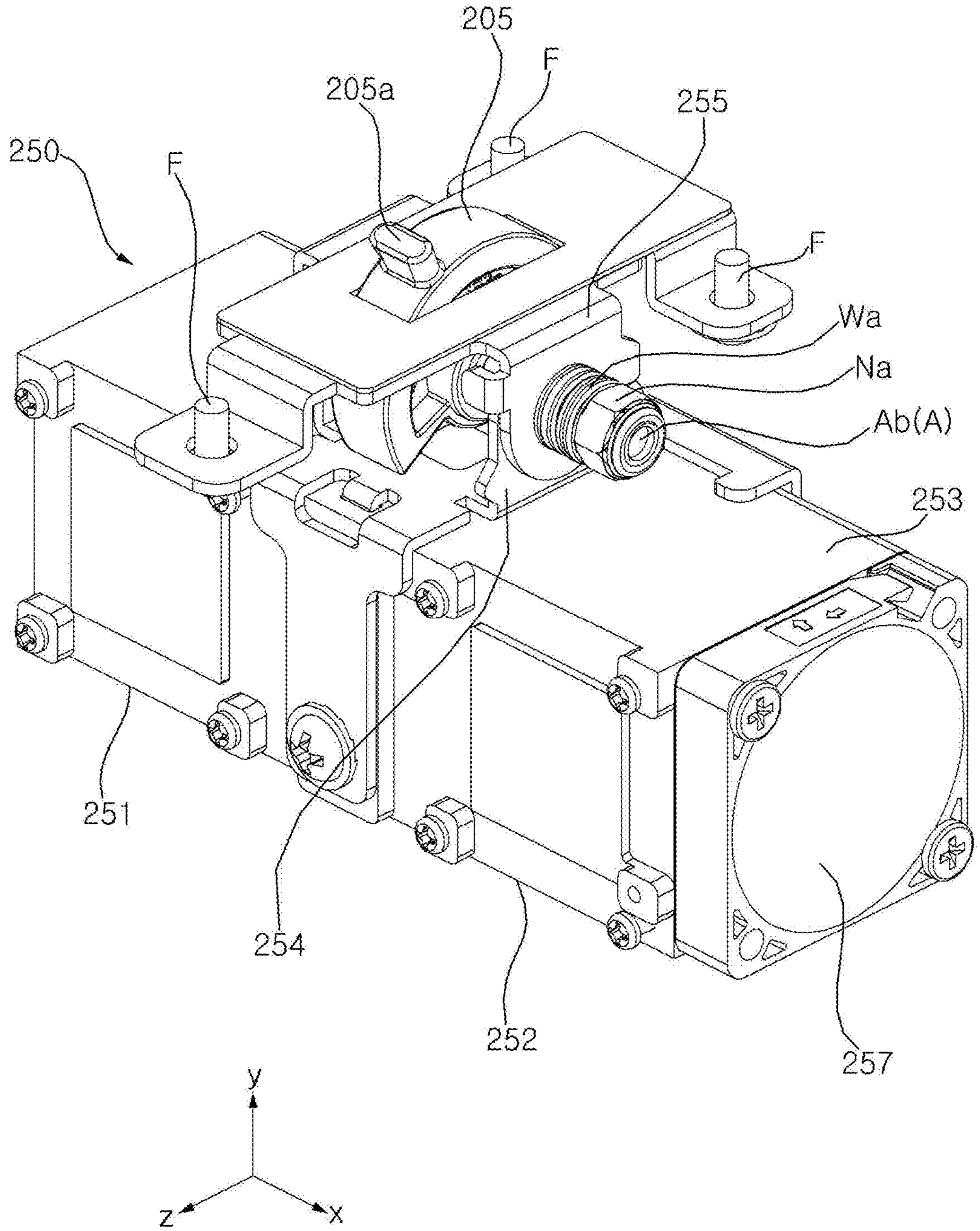

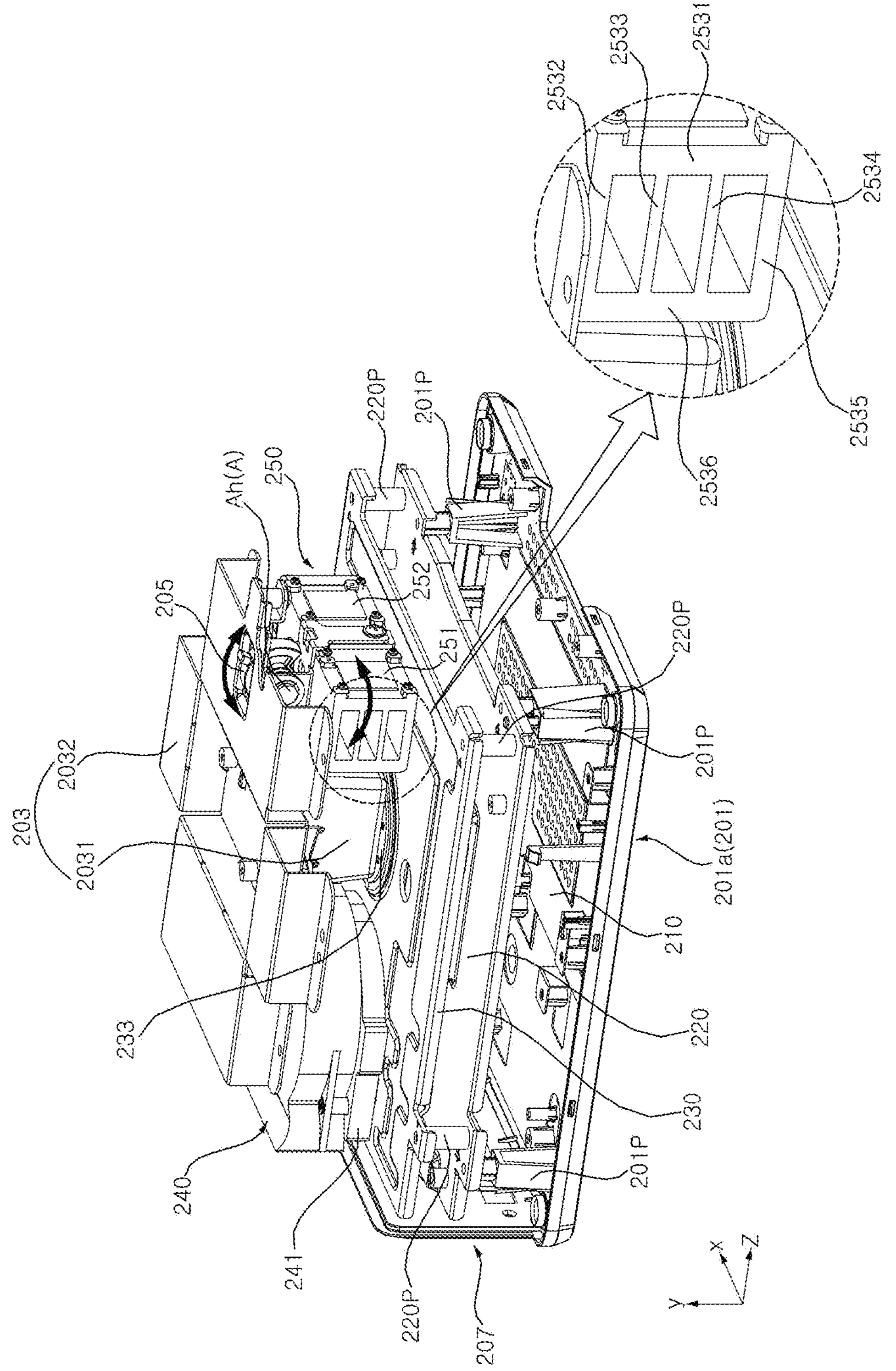
[FIG. 10]

[FIG. 11]
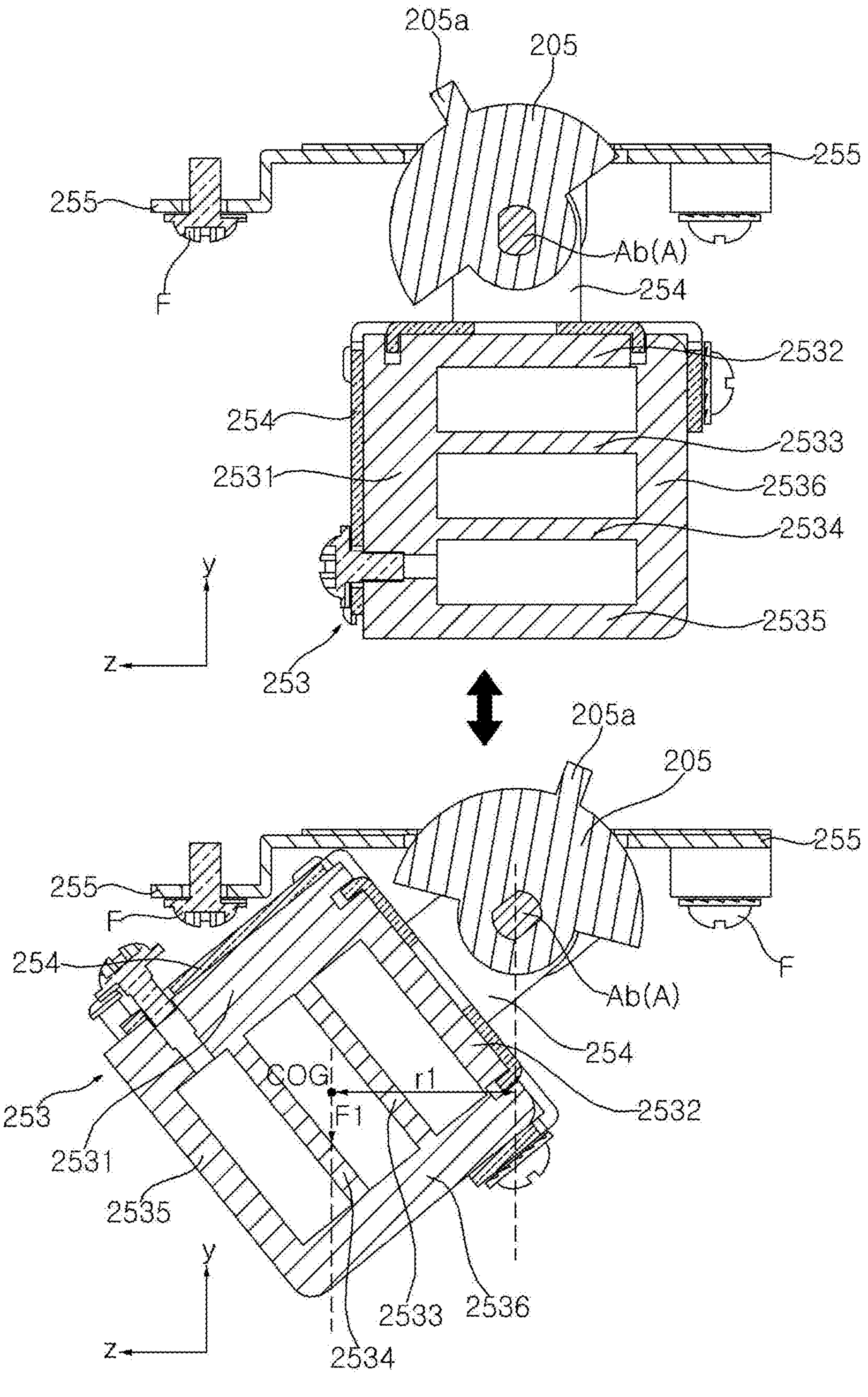

[FIG. 12]
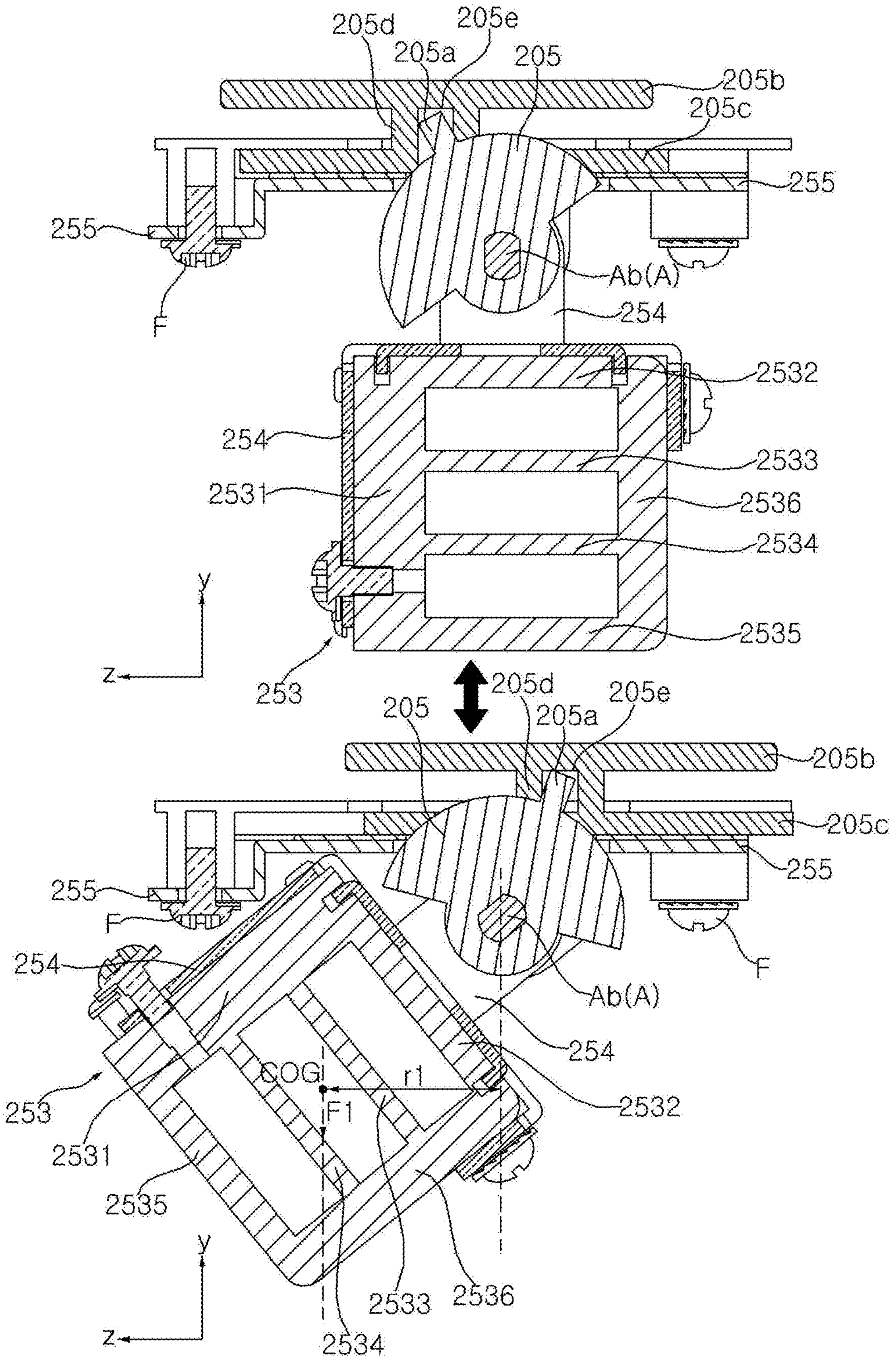

[FIG. 13]
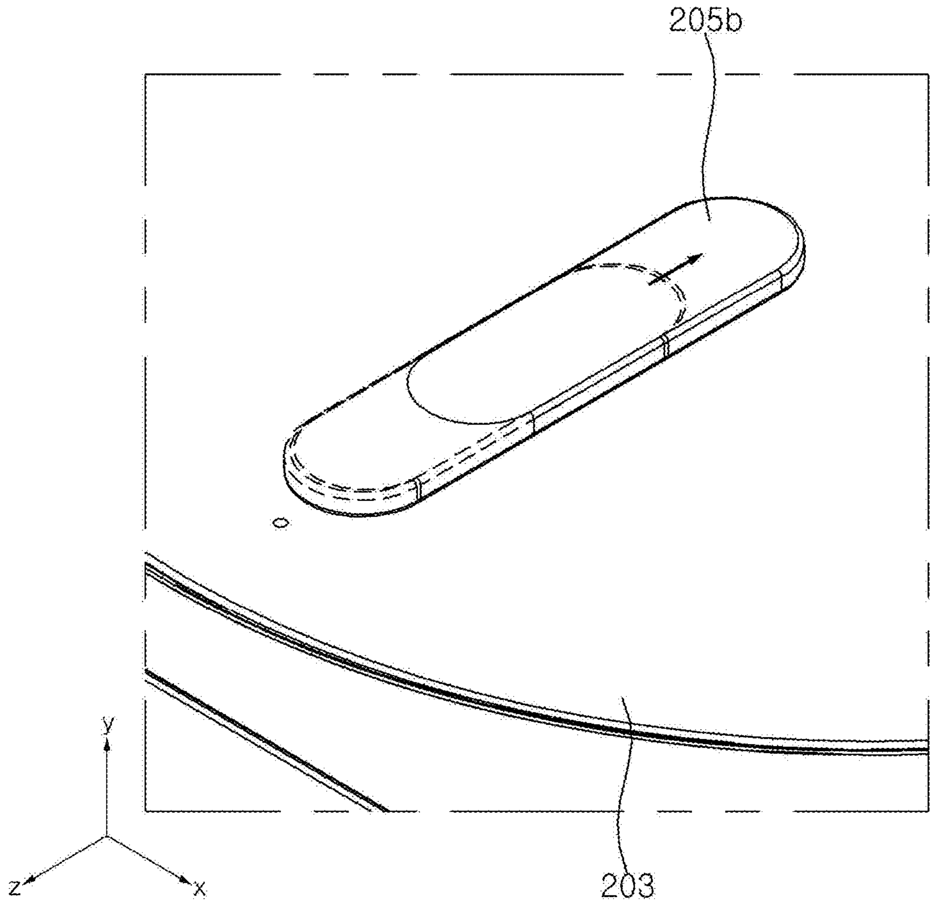

[FIG. 14]
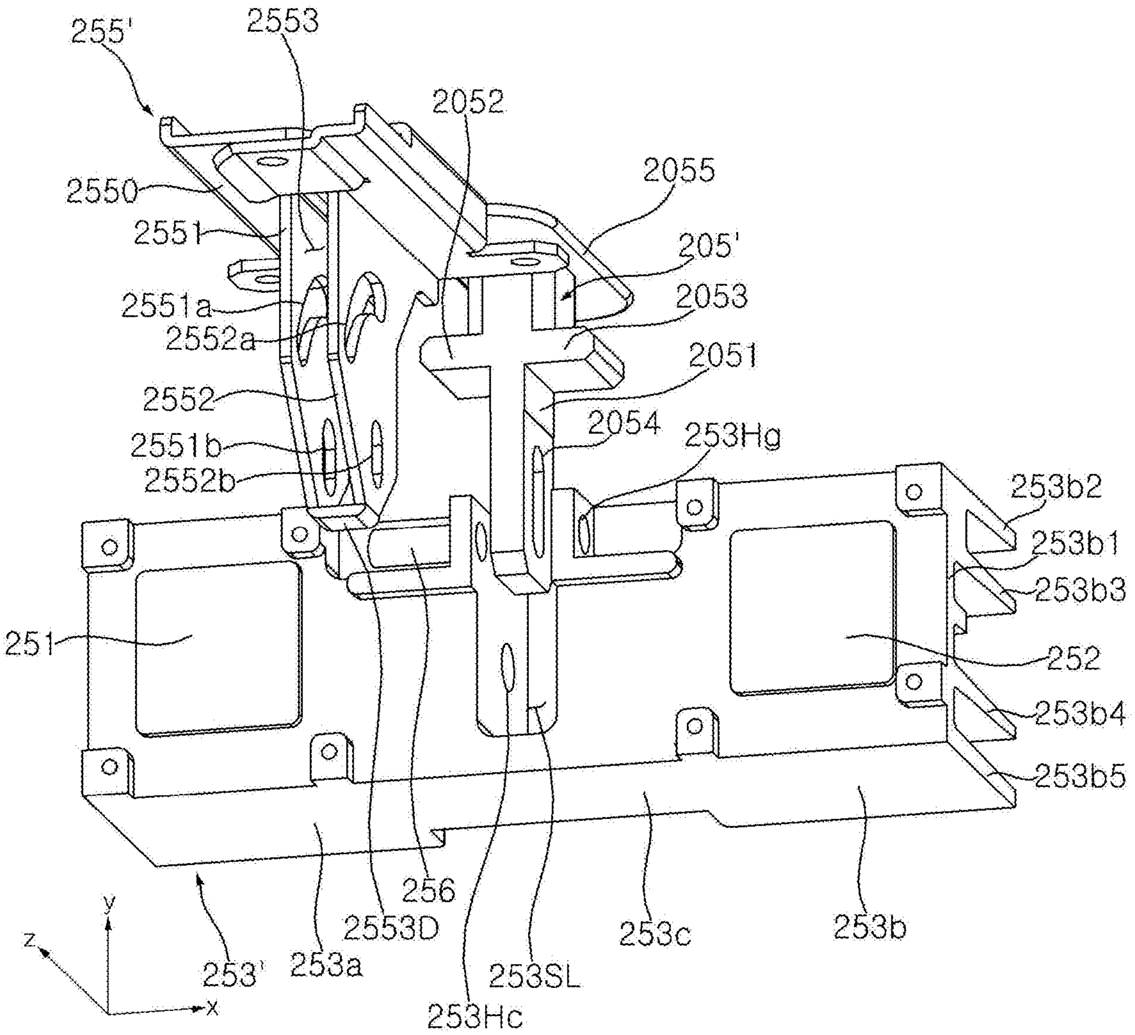

[FIG. 15]
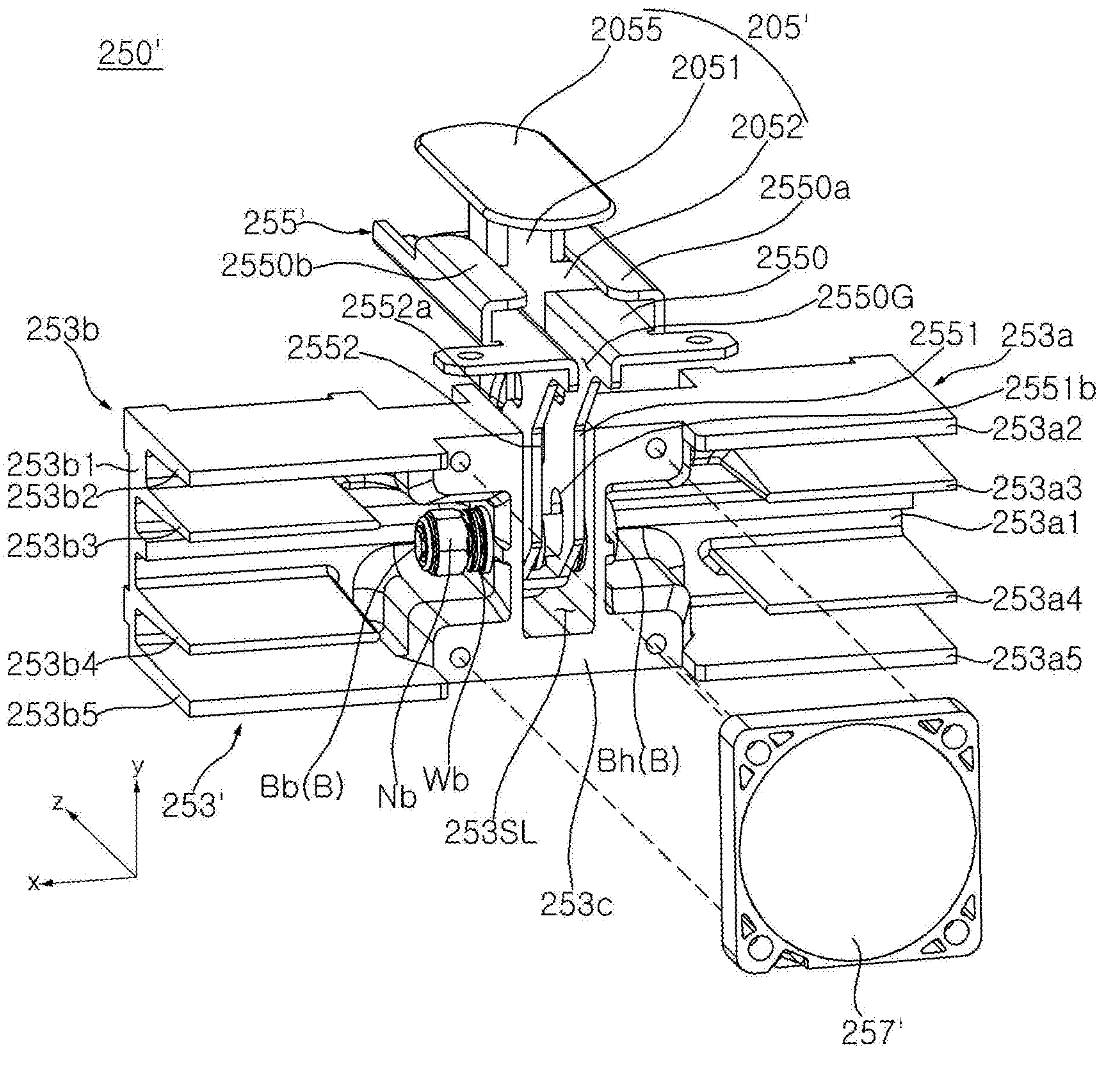

[FIG. 16]
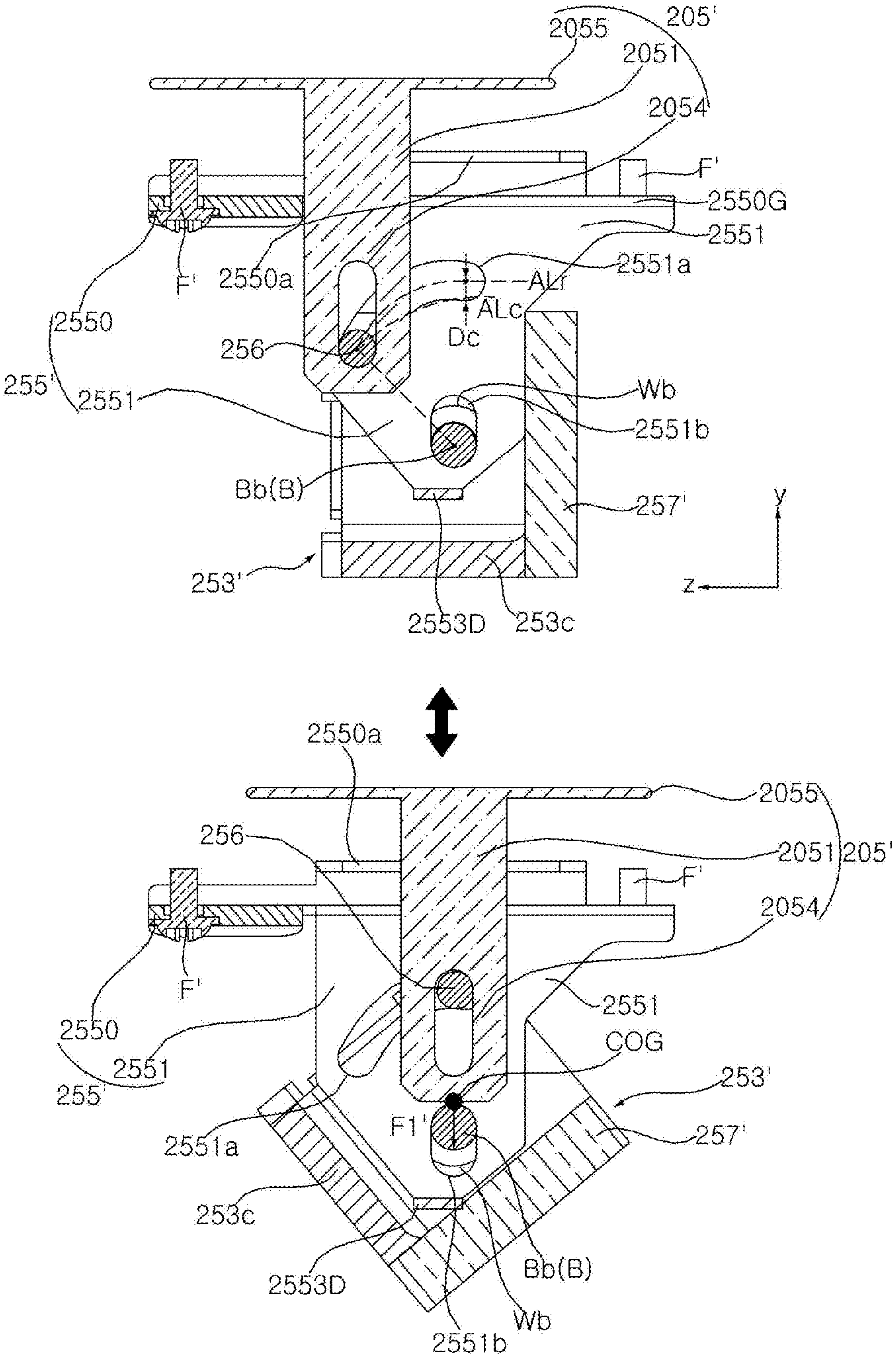

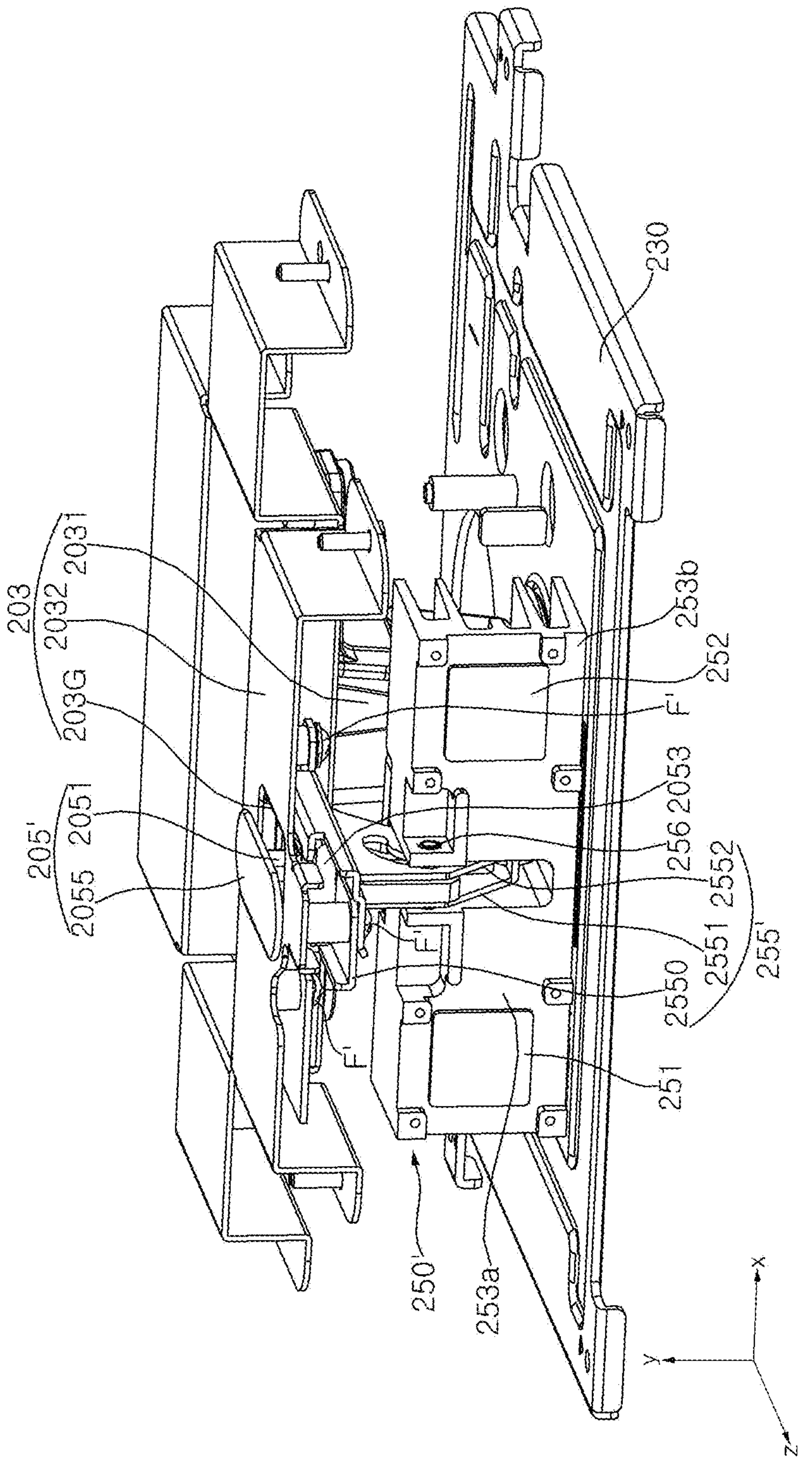
[FIG. 17]

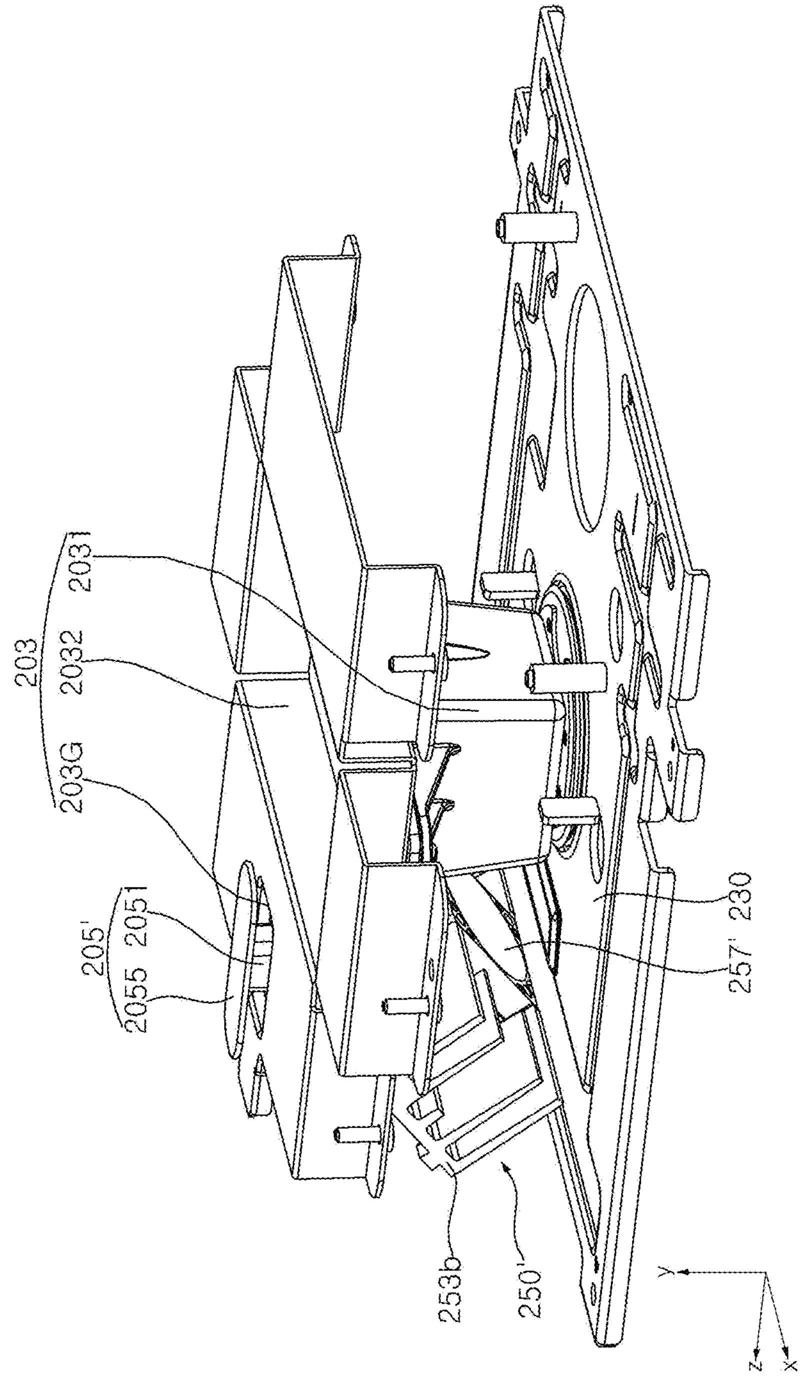
[FIG. 18]

[FIG. 19]
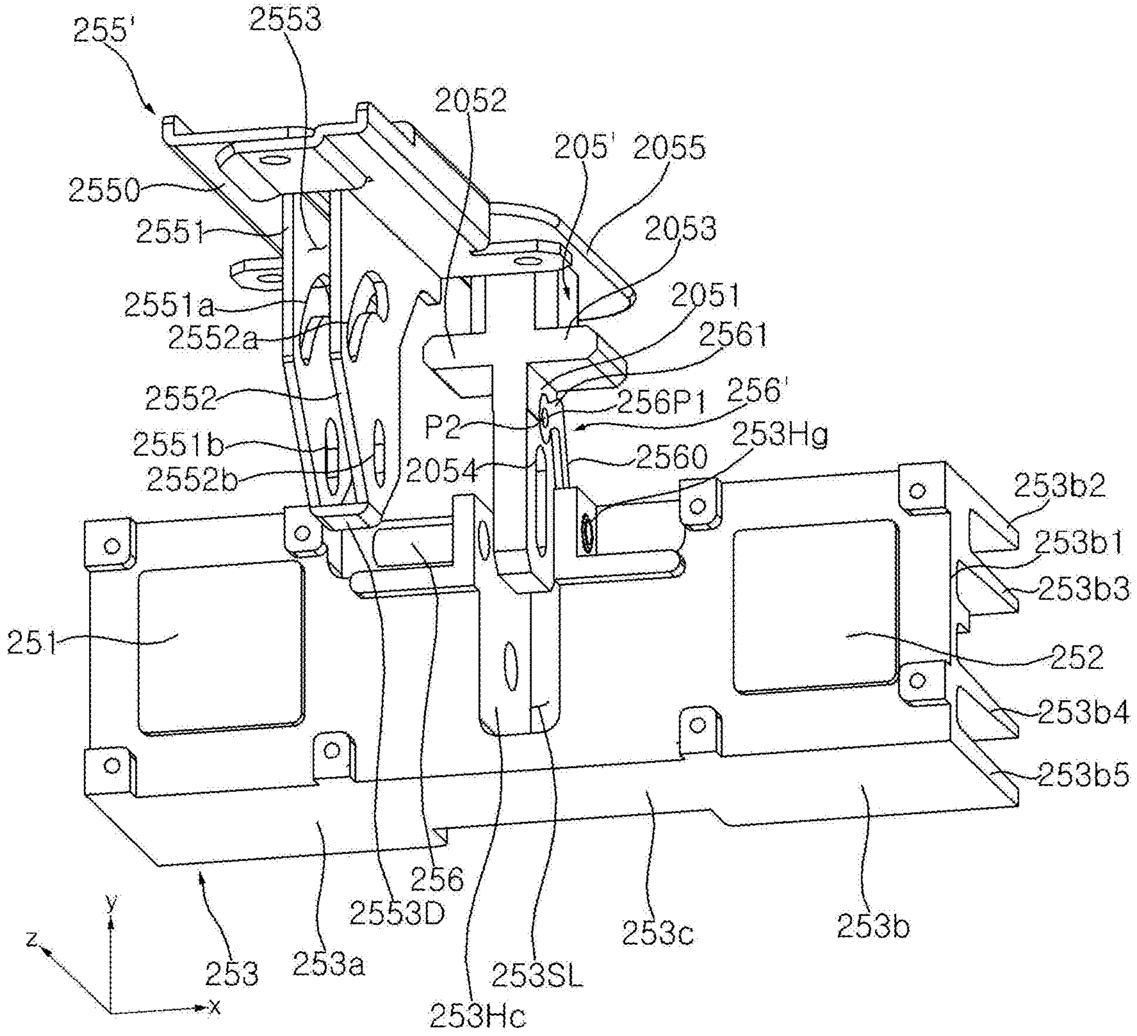

[FIG. 20]
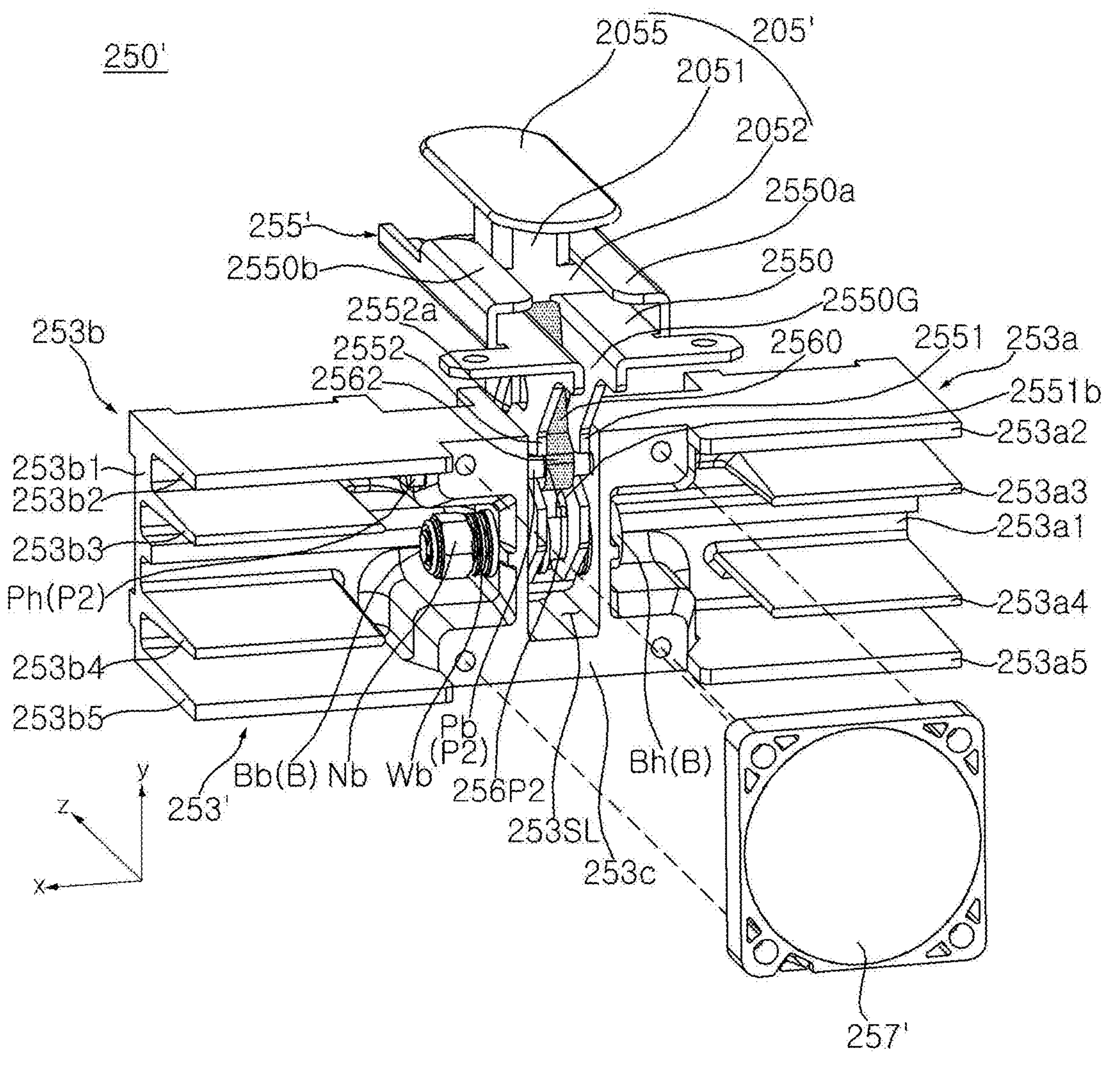

[FIG. 21]
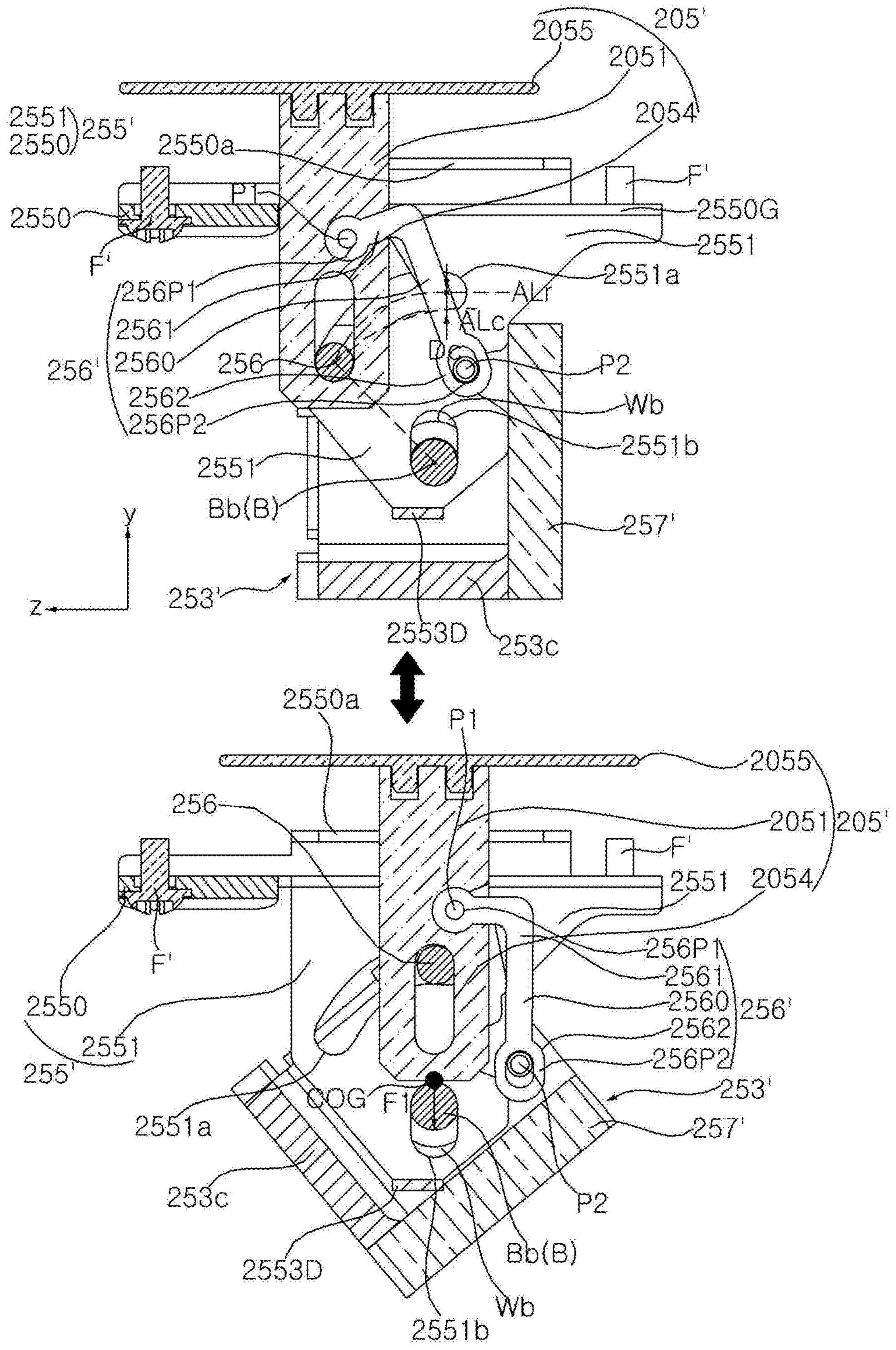

[FIG. 22]
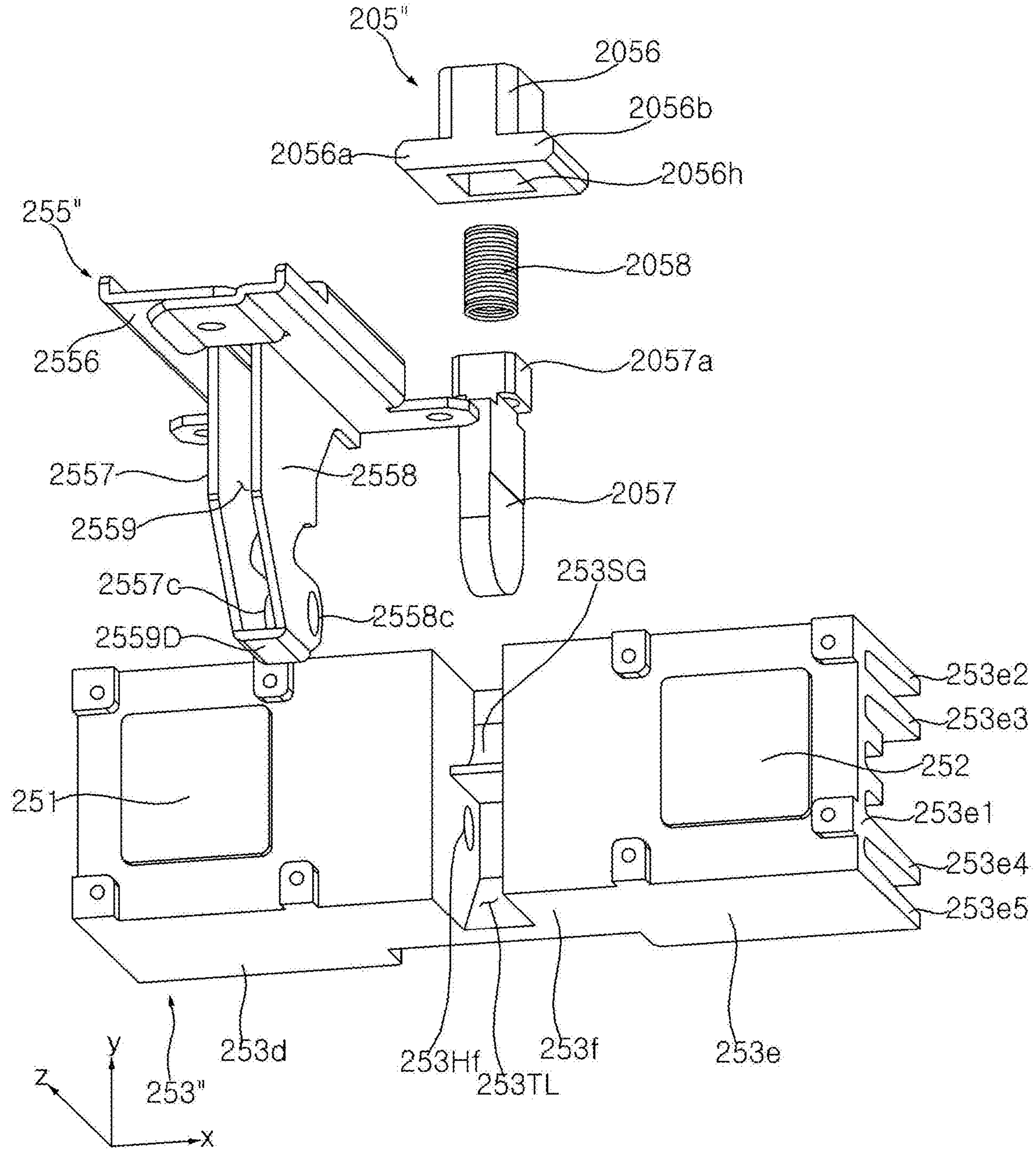

[FIG. 23]
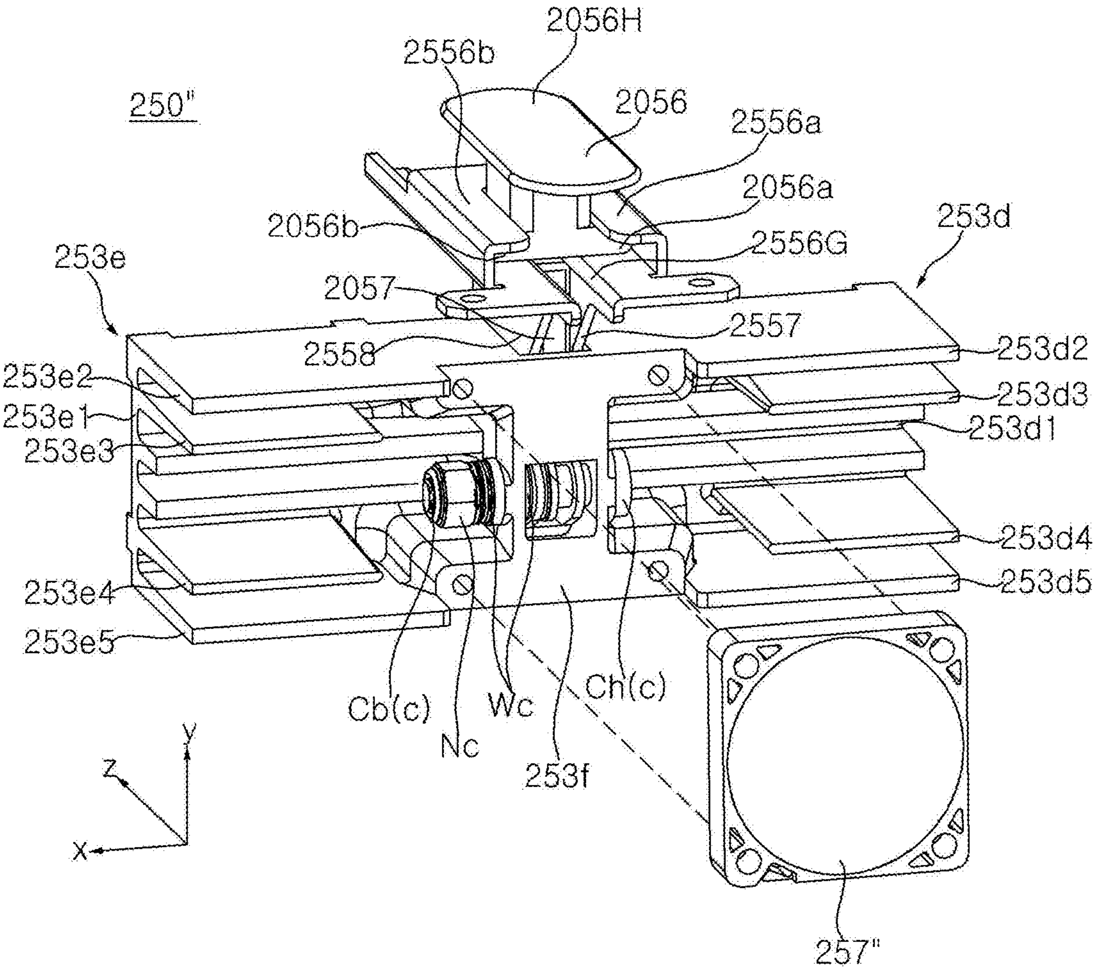

[FIG. 24]
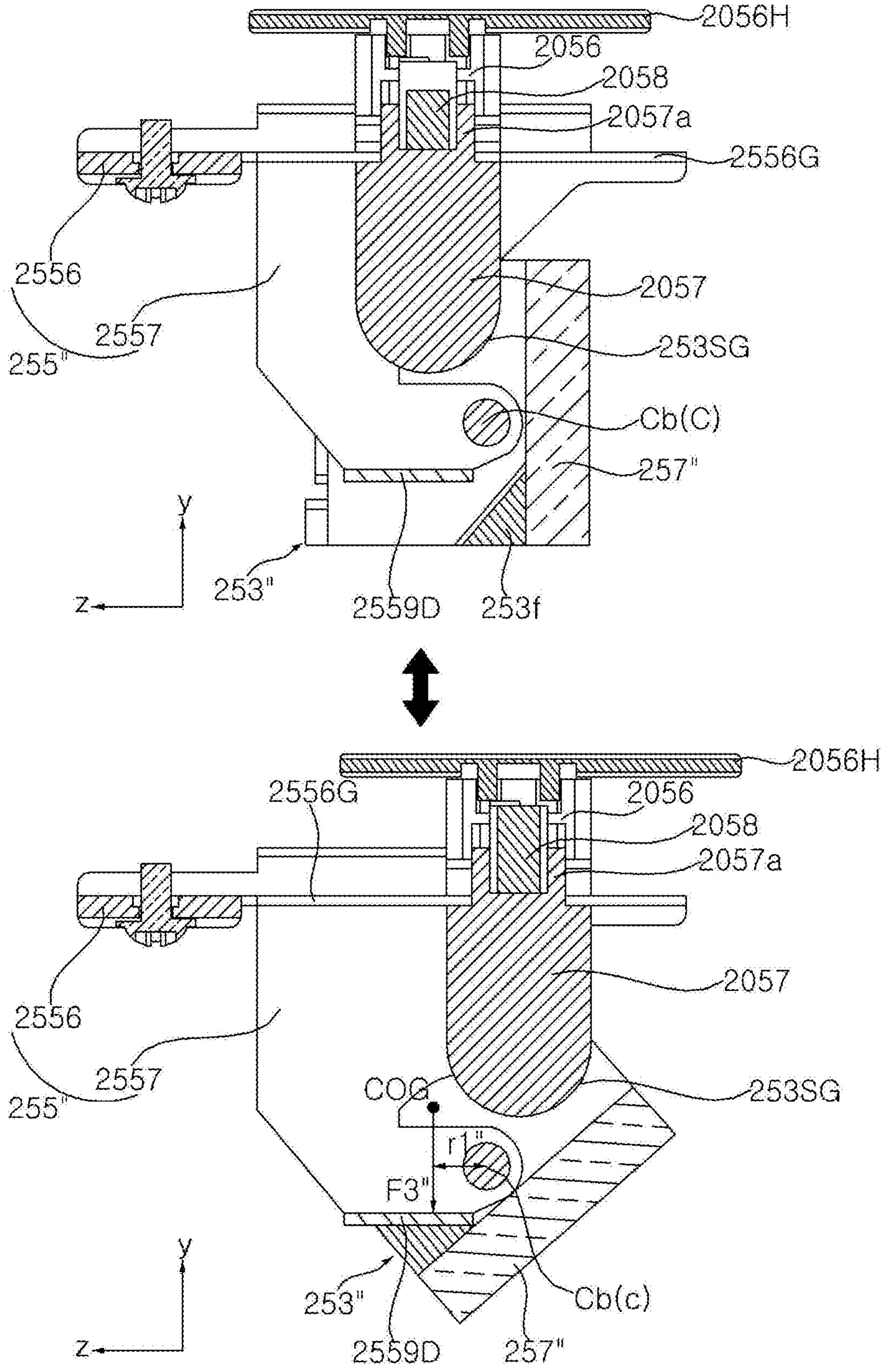

[FIG. 25]
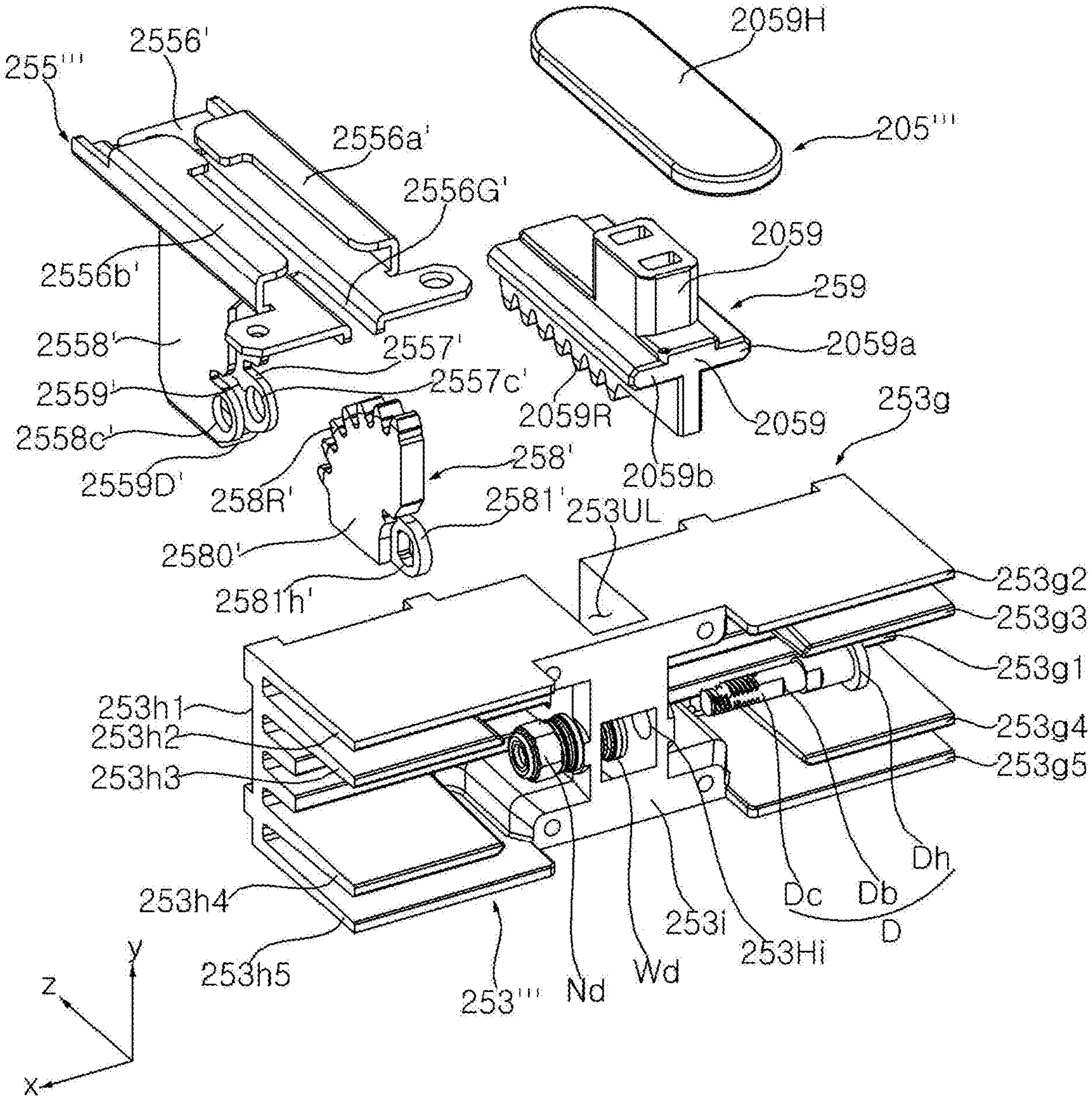

[FIG. 26]
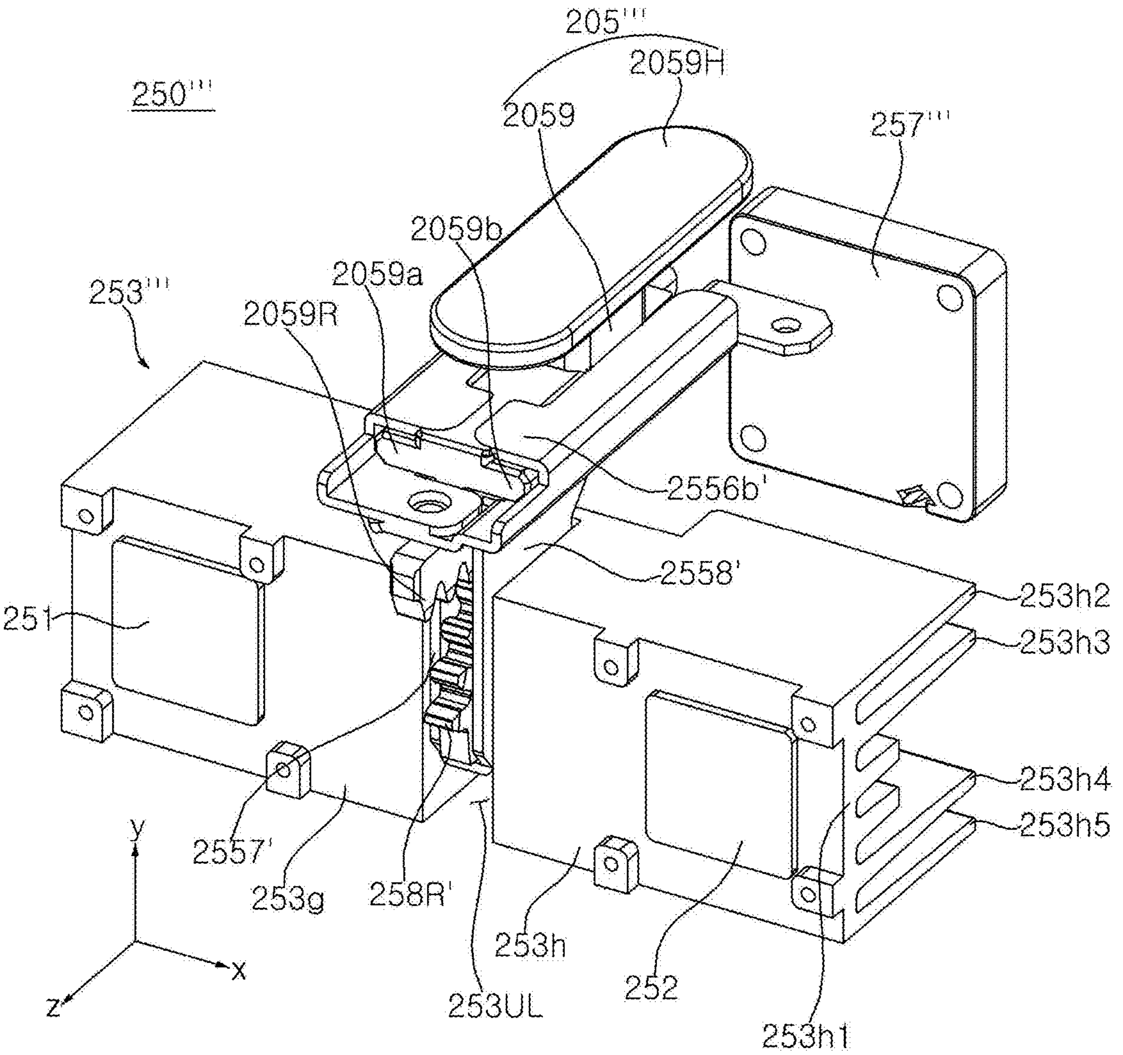

[FIG. 27]
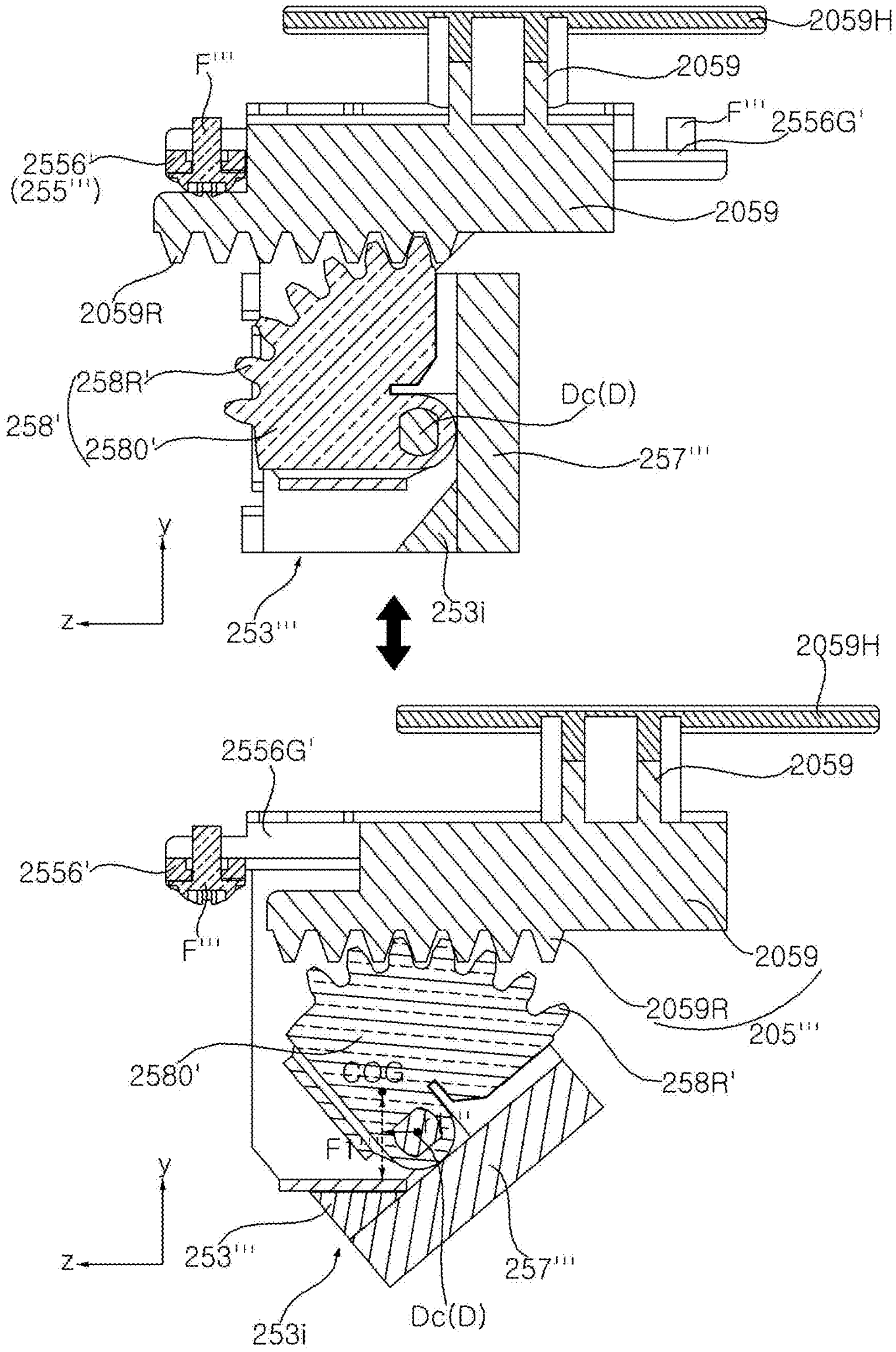

[FIG. 28]
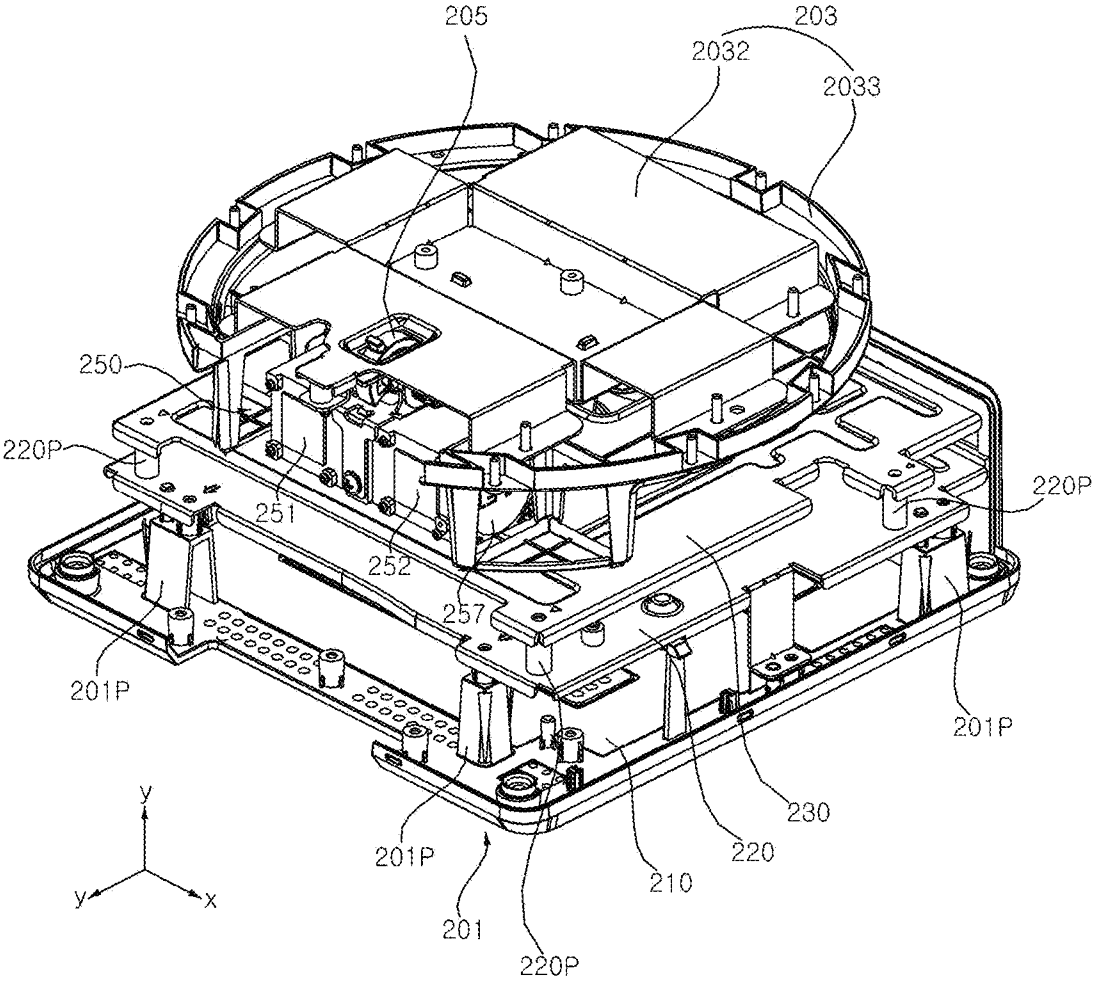

[FIG. 29]
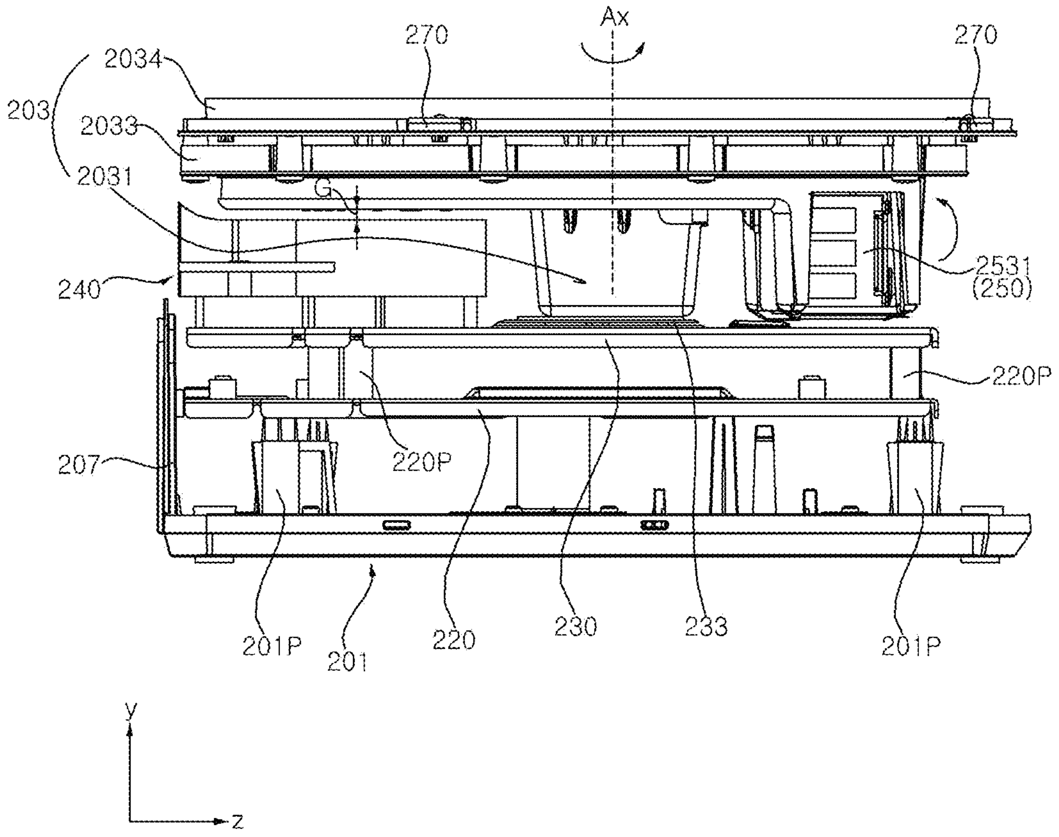

[FIG. 30]
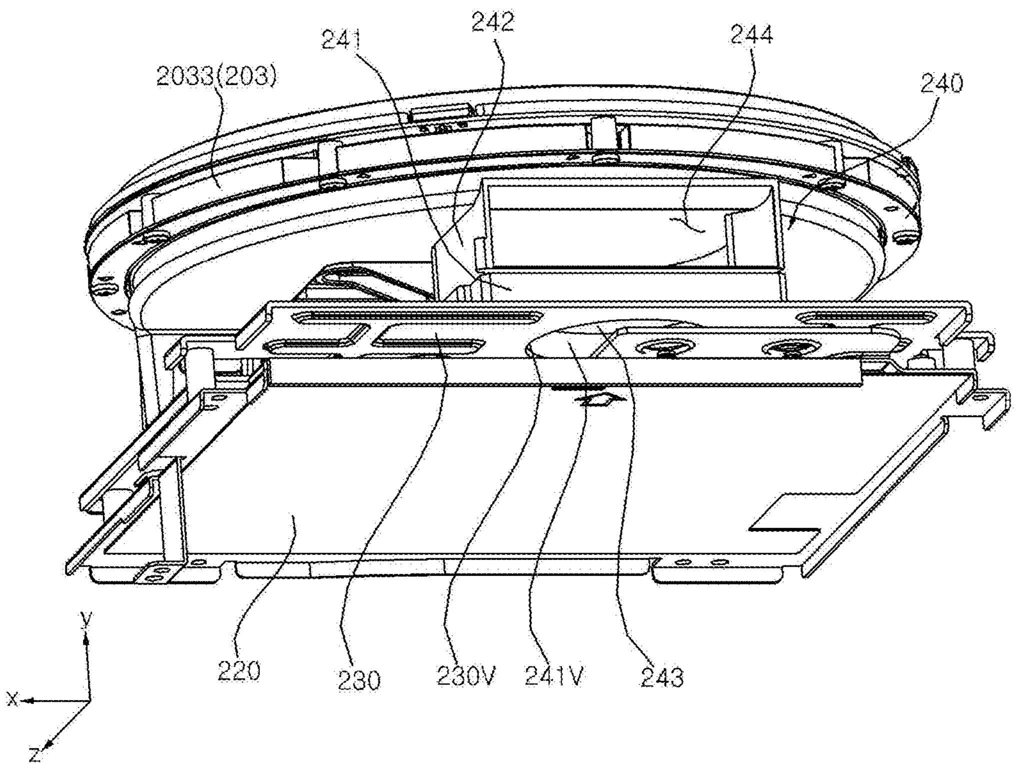

[FIG. 31]
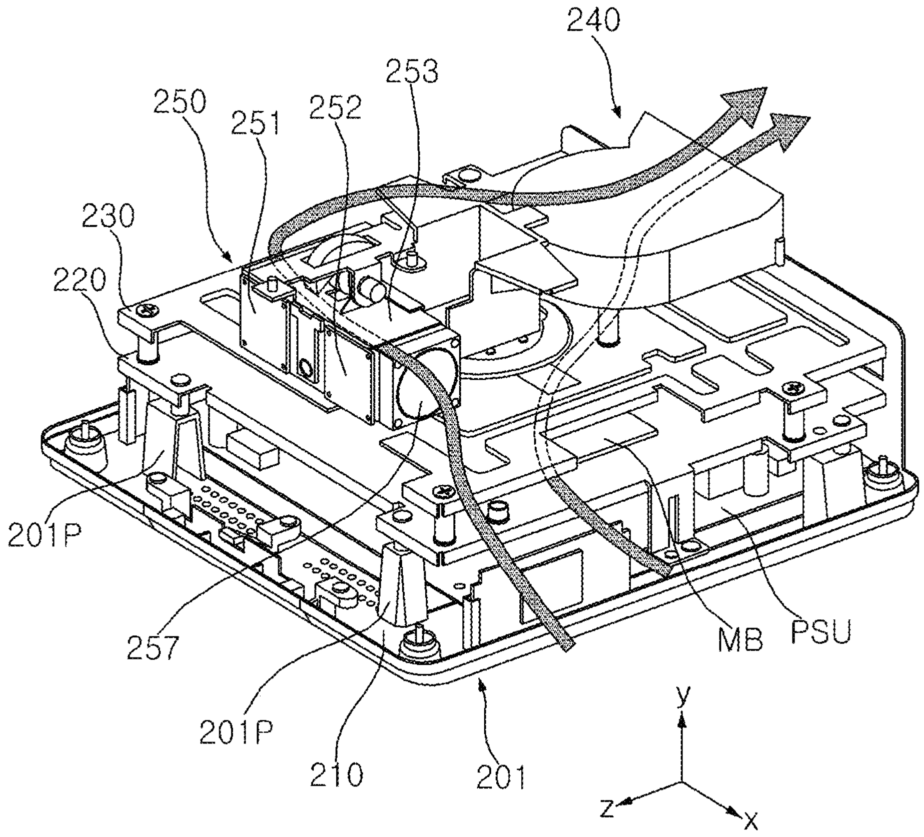

[FIG. 32]
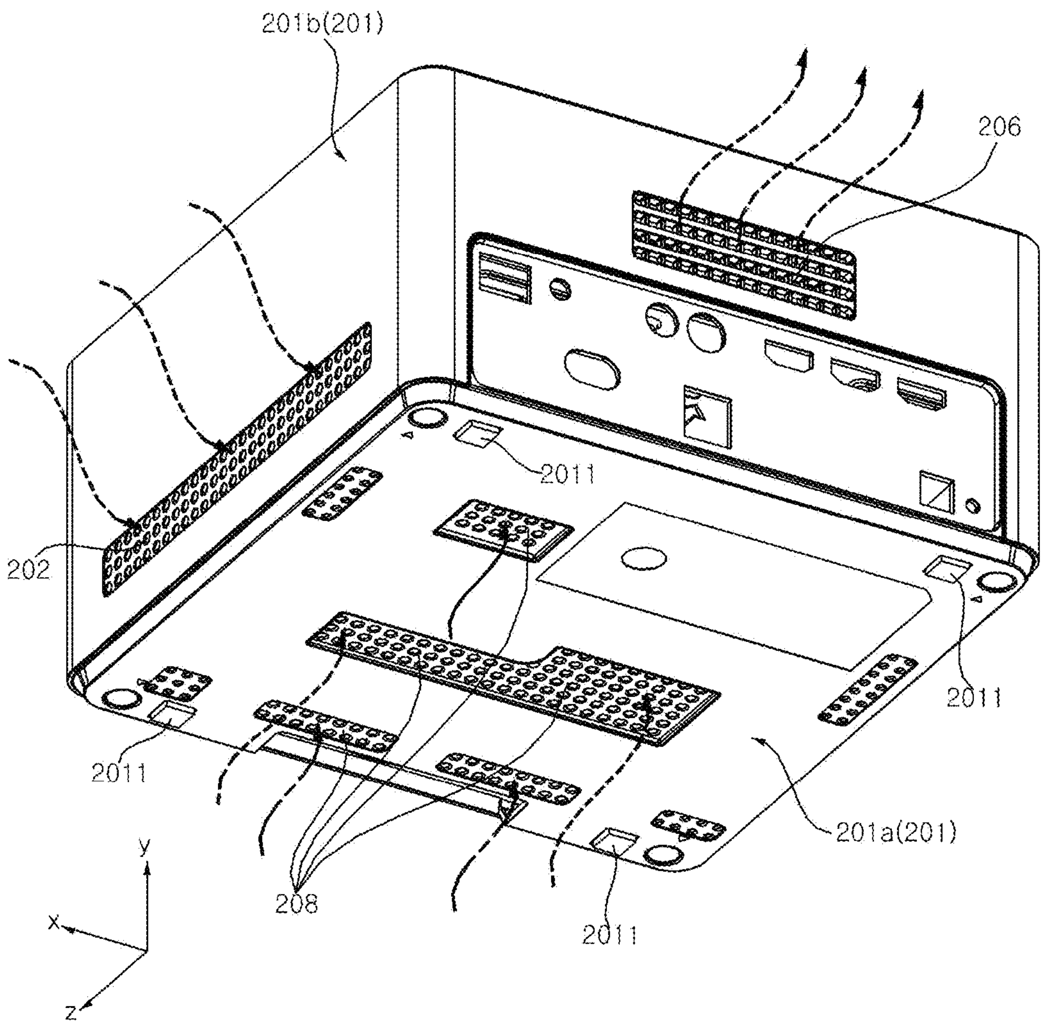

[FIG. 33]
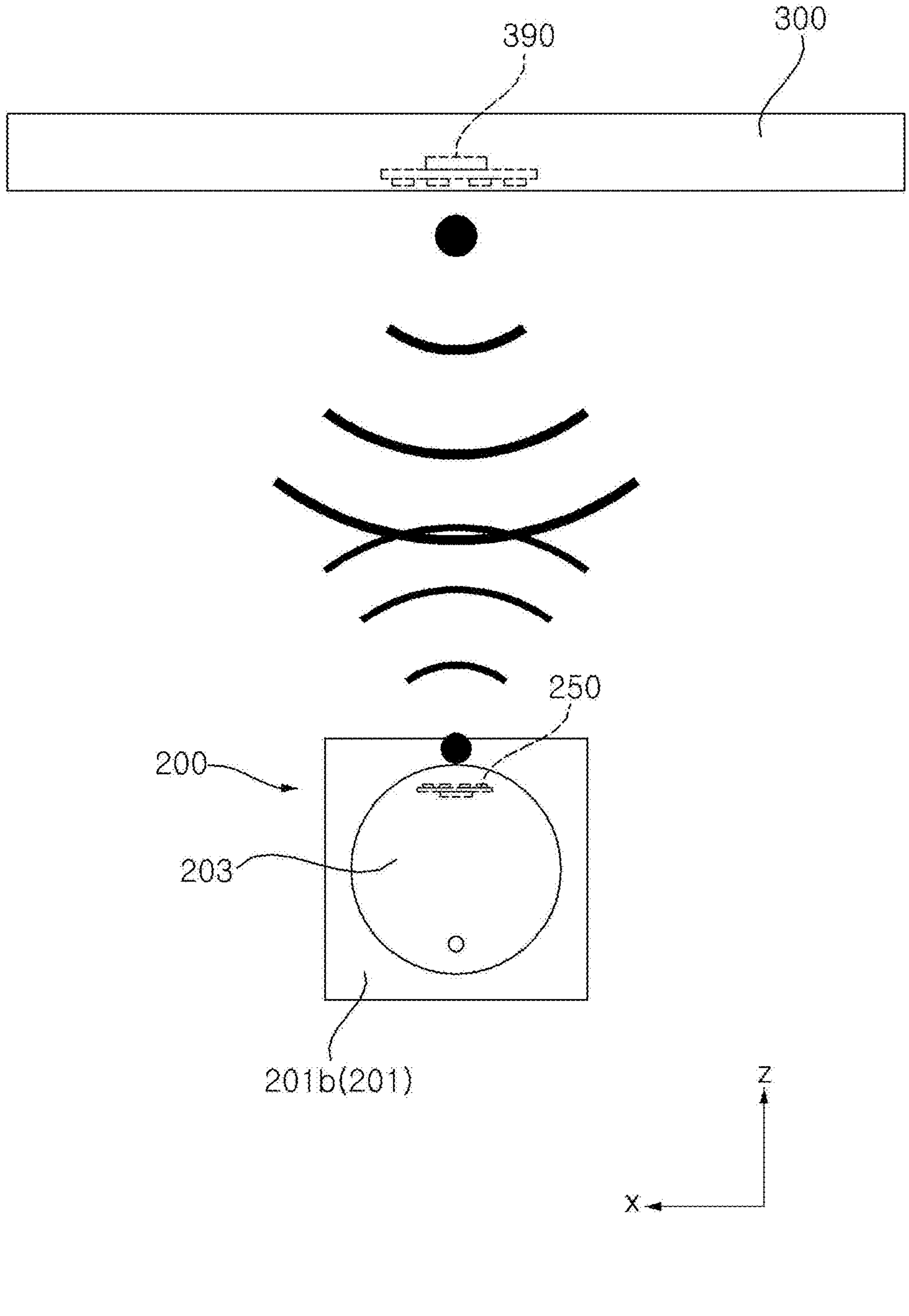

[FIG. 34]
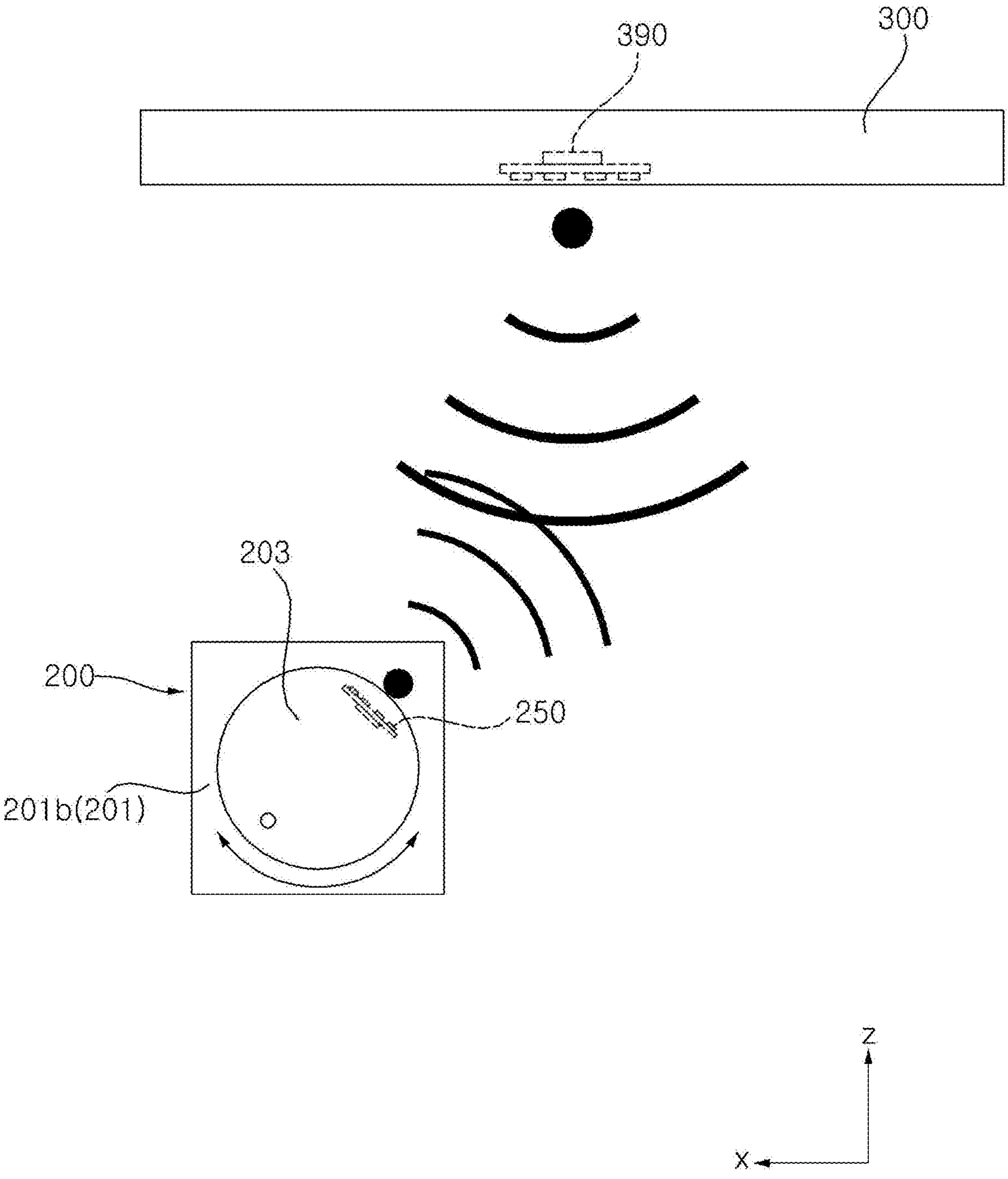

CONTROL BOX AND DISPLAY DEVICE COMPRISING SAME

CROSS REFERENCE TO RELATED APPLICATIONS

This application is the National Phase of PCT International Application No. PCT/KR2022/015002, filed on Oct. 5, 2022, which is hereby expressly incorporated by reference into the present application.

TECHNICAL FIELD

The present disclosure relates to a control box and a display device having the same.

BACKGROUND ART

With the development of information society, there has been a growing demand for various types of display devices. In order to meet such demand, various display devices, such as a Liquid Crystal Display (LCD) device, an Organic Light Emitting Diode (OLED) display, a Micro LED device, and the like, have been developed and used.

Among them, an LCD panel includes a TFT substrate and a color substrate that are opposite each other with a liquid crystal layer interposed therebetween, and can display an image using light provided from a backlight unit. In addition, an OLED panel can display an image by depositing a self-luminescent organic layer on a substrate having a transparent electrode formed thereon. In particular, a display device including an OLED panel requires no backlight unit, which is advantageous to achieve an ultra-thin profile.

A control box may be placed at a position apart from a head including a display panel and used in close proximity to a user. The control box can provide various information to the head. For example, the control box may be an AV box. The control box can exchange information wired/wireless with a head equipped with a display panel that displays an image. Recently, numerous research has been conducted on the connectivity of such a display device.

DETAILED DESCRIPTION OF INVENTION

Technical Problems

An object of the present disclosure may be to provide a control box configured to be wirelessly connected to a head including a display panel.

Another object may be to provide a mechanism that can improve the reception rate of an antenna of a wireless control box.

Another object may be to provide a mechanism for adjusting the position and/or angle of a communication module.

Another object may be to provide a structure that can minimize torque applied to a tilted communication module.

Another object may be to provide a structure that allows a user to tilt a communication module with a relatively small force.

Another object may be to provide various mechanisms for tilting a communication module.

Technical Solution

In accordance with an aspect of the present disclosure for achieving the above and other objects, a control box may include: a case; a bracket disposed inside the case and coupled to the case; and a communication module rotatably coupled to the bracket, wherein the communication module may include: an antenna unit; a heat sink to which the antenna unit is mounted and which is elongated, the heat sink overlapping a portion of the bracket in a longitudinal direction of the heat sink; and a connecting shaft extending in the longitudinal direction of the heat sink and connecting the heat sink and the bracket, and wherein the connecting shaft may provide an axis of rotation for the communication module.

In accordance with another aspect of the present disclosure, a display device may include: a head including a display panel; and a control box communicating with the head.

Effect of Invention

The effects of a control box and a display device having the same according to the present disclosure are as follows.

According to at least one of the embodiments of the present disclosure, it is possible to provide a control box that is wirelessly connected to a head including a display panel.

According to at least one of the embodiments of the present disclosure, it is possible to provide a mechanism capable of improving the reception rate of an antenna of a wireless control box.

According to at least one of the embodiments of the present disclosure, it is possible to provide a mechanism for adjusting the position and/or angle of a communication module.

According to at least one of the embodiments of the present disclosure, it is possible to provide a structure capable of minimizing torque applied to a tilted communication module.

According to at least one of the embodiments of the present disclosure, it is possible to provide a structure that allows a user to tilt a communication module with a relatively small force.

According to at least one of the embodiments of the present disclosure, it is possible to provide various mechanisms for tilting a communication module.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

BRIEF DESCRIPTION OF THE DRAWING

FIGS. 1 to 34 are diagrams illustrating examples of a control box and a display device having the same according to embodiments of the present disclosure.

MODE FOR CARRYING OUT THE INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, suffixes such as “module” and “unit” may be used to refer to elements or components.

Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

Although the terms "first", "second", etc. may be used herein to describe various elements, these elements should not be limited by these terms. These terms are only used to distinguish one element from another.

It will be understood that when a component is referred to as being "connected" or "coupled" to another component, it may be directly connected to or coupled to another component, or intervening components may be present. In contrast, when a component is referred to as being "directly connected" or "directly coupled" to another component, there are no intervening components present.

As used herein, a singular representation is intended to include a plural representation unless the context clearly indicates otherwise.

It will be further understood that the terms "comprises or includes" and/or "has" when used in this specification, specify the presence of a stated feature, number, step, operation, component, element, or combination thereof, but do not preclude the presence or addition of one or more other features, numbers, steps, operations, components, elements, or combinations thereof.

Referring to FIG. 1, a head 300 of a display device may include a display panel 110. The display panel 110 may display an image.

The head 300 of the display device may include a first long side LS1, a second long side LS2 opposite the first long side LS1, a first short side SS1 adjacent to the first long side LS1 and the second long side LS2, and a second short side SS2 opposite the first short side SS1. Meanwhile, for ease of explanation, it is illustrated and described that lengths of the first and second long sides LS1 and LS2 are greater than lengths of the first and second short sides SS1 and SS2, but the lengths of the first and second long sides LS1 and LS2 may be substantially equal to the lengths of the first and second short sides SS1 and SS2.

A direction parallel to the long sides LS1 and LS2 of the head 300 may be referred to as a first direction DR1 or a left-and-right direction. A direction parallel to the short sides SS1 and SS2 of the head 300 may be referred to as a second direction DR2 or an up-and-down direction. A direction perpendicular to the long sides LS1 and LS2 and the short sides SS1 and SS2 of the head 300 may be referred to as a third direction DR3 or a front-and-rear direction.

A direction in which the head 300 displays an image may be referred to as a front, and a direction opposite to the front may be referred to as a rear. The first short side SS1 may be referred to as a left side. The second short side SS2 may be referred to as a right side. The first long side LS1 may be referred to as an upper side. The second long side LS2 may be referred to as a lower side.

The first long side LS1, the second long side LS2, the first short side SS1, and the second short side SS2 may be referred to as edges of the head 300. Points where the first long side LS1, the second long side LS2, the first short side SS1, and the second short side SS2 meet one another may be referred to as corners.

A point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

Referring to FIG. 2, the head 300 may include a display panel 110, a main frame 330, and an inner plate 350.

The display panel 110 may define a front surface of the head 300, and may display an image. For example, the display panel 110 may be an OLED panel, an LCD panel, or an LED panel.

The main frame 330 may be positioned behind the display panel 110, and the display panel 110 may be coupled to the main frame 330. A bottom frame 331 may extend along a lower end of the main frame 330, and may be detachably coupled to the main frame 330. The bottom frame 331 may cover a lower end of the display panel 100.

The inner plate 350 may be disposed between the display panel 110 and the main frame 330, and may be coupled to the main frame 330. An adhesive member 353 such as double-sided tape may be attached to a front surface of the inner plate 350 and a rear surface of the display panel 110.

Referring to FIG. 3, a plurality of electronic components may be mounted on a rear surface of the main frame 330. A power supply board 332 may be adjacent to a left side of the main frame 330, and may be mounted on the rear surface of the main frame 330. A main board 333 may be adjacent to a right side of the main frame 330, and may be mounted on the rear surface of the main frame 330. A speaker unit 334 may be adjacent to a lower side of the main frame 330, and may be mounted on the rear surface of the main frame 330.

A timing controller board 335 may be disposed between the power supply board 332 and the main board 333, and may be mounted on the rear surface of the main frame 330. A shield plate 400 may cover the timing controller board 335, and may be mounted on the rear surface of the main frame 330.

Referring to FIG. 4, a control box 200 may be positioned apart from the head 300. The control box 200 may wirelessly exchange information with the head 300. The stability of wireless communication between the control box 200 and the head 300 may vary depending on the relative positions of the control box 200 and the head 300. The position where the head 300 is placed may be constant (or fixed) to maintain a certain distance from a user. In the case of the control box 200, for user convenience, it is necessary to increase the degree of freedom with which the control box 200 is placed.

Referring to FIG. 5, the directions "up (U, y)", "down (D)", "left (Le, x)", "right (Ri)", "front (F, z)", and "rear (R)" shown in the drawing are merely for convenience of description, and the technical concept disclosed herein is not limited by these directions.

Referring to FIGS. 5 to 7, a case 201 of the control box 200 may have the shape of a generally square box. A rotating plate 203 may have the shape of a circular plate, and may be rotatably coupled to a top of the case 201. The rotating plate 203 may have an opening 203OP adjacent to an outer circumference of the rotating plate 203. The opening 203OP may extend in a diameter direction of the rotating plate 203. A dial 205 may be installed in the case 201, and may be exposed to an outside of the case 201 through the opening 203OP. The dial 205 may be movable in a longitudinal direction of the opening 203OP.

A first inlet hole 202 may be formed in a left surface of the case 201, and may be adjacent to a bottom of the case 201. A second inlet hole 204 may be formed in a right surface of the case 201, and may be adjacent to the bottom of the case 201.

An outlet hole 206 may be formed in a rear surface of the case 201, and may be adjacent to the top of the case 201. A plurality of terminal holes 207 may be formed in the rear surface of the case 201, and may be adjacent to the bottom of the case 201.

Referring to FIG. 8, a first plate 210 may be positioned on the bottom of the case 201. The first plate 210 may include a metal material, and an insulating layer 211 may be positioned on the first plate 210. A third inlet hole 208 may be formed at the bottom of the case 201, and the first plate 210 may have an opening (no reference numeral) that corresponds to the third inlet hole 208.

A second plate 220 may be spaced upward from the first plate 210. Columns 201P may protrude upward from the bottom of the case 201, and the second plate 220 may be fixed to the columns 201P.

A third plate 230 may be spaced upward from the second plate 220. Columns 220P may protrude upward from the second plate 220, and the third plate 230 may be fixed to the columns 220P. A forming portion 231 may be formed on one surface of the third plate 230, thereby improving torsional rigidity and/or bending rigidity of the third plate 230. A rotation support 233 may be provided on the third plate 230, and a rotating shaft 235 may be provided at the rotation support 233.

A fan 240 may be mounted on the third plate 230. A buffer member 241 may be disposed between the third plate 230 and the fan 240. For example, the buffer member 241 may be rubber or sponge.

Referring to FIGS. 9 and 10, a communication module 250 may include an antenna unit 251, 252, a heat sink 253, a cooling fan 257, a dial 205, and brackets 254 and 255.

The heat sink 253 may have the shape of an elongated rectangular prism. A first antenna unit 251 may be coupled to one surface of the heat sink 253. A second antenna unit 252 may be coupled to the one surface of the heat sink 253 in a manner that is aligned side by side with the first antenna unit 251. A front surface of the antenna unit 251, 252 may face outward, and at least a portion of a rear surface of the antenna unit 251, 252 may be in contact with the heat sink 253.

In addition, the heat sink 253 may include a front part 2531, a rear part 2536, a top part 2532, a bottom part 2535, and fins 2533 and 2534. The antenna units 251 and 252 may be mounted to the front part 2531. The rear part 2536 may be opposite the front part 2531. The top part 2532 may connect an upper end of the front part 2531 and an upper end of the rear part 2536. The bottom part 2535 may connect a lower end of the front part 2531 and a lower end of the rear part 2536. The fins 2533 and 2534 may be positioned between the top part 2532 and the bottom part 2535, and may connect the front part 2531 and the rear part 2536.

The cooling fan 257 may be coupled to one side of the heat sink 253. The cooling fan 257 may cause a flow of air through the heat sink 253. The cooling fan 257 may direct air into a flow path formed between the top part 2532, the fins 2533 and 2534, and the bottom part 2535. Accordingly, the cooling fan 257 may effectively remove heat generated from the antenna units 251 and 252.

The brackets 254 and 255 may include a first bracket 254 and a second bracket 255. The first bracket 254 may be coupled onto the heat sink 253 via a fastening member such as a screw. The second bracket 255 may be positioned under the rotating plate 203, and may be coupled to the rotating plate 203 via a fastening member F such as a screw. A connecting shaft A may pass through the second bracket 255 and the first bracket 254. The connecting shaft A may rotate relative to the second bracket 255, and may be fixed to the first bracket 254. The dial 205 may be fixed to an outer circumference of the connecting shaft A. Accordingly, the dial 205, the connecting shaft A, the first bracket 254, and the heat sink 253 may pivot relative to the second bracket 255 fixed to the rotating plate 203. A central axis of the pivoting movement may be a longitudinal axis of the connecting shaft A.

In addition, the connecting shaft A may include a head Ah and a body Ab. The head Ah may be caught on a first side of the second bracket 255. The body Ab may extend from the head Ah, and may pass through the first side and a second side of the second bracket 255. A fastening member Na such as a nut may be fastened to an outer circumference of the body Ab passing through the second side of the second bracket 255. A washer Wa may be disposed between the second side of the second bracket 255 and the fastening member Na and between the second bracket 255 and the first bracket 254, and may be penetrated by the body Ab. For example, the washer Wa may be a disc spring that can generate an elastic force in an axial direction. Accordingly, as the fastening member Na is more strongly (or firmly) fastened to the body Ab (i.e., as the fastening member Na fastened to the body Ab is closer to the second side of the second bracket 255, a frictional force between the second bracket 255 and the washer Wa (or a frictional force between the second bracket 255 and the first bracket 254) increases, thereby requiring more force for the first bracket 254 to pivot relative to the second bracket 255.

Meanwhile, the dial 205 may have a semi-circle or fan shape. An arcuate surface of the dial 205 may pass through the second bracket 255 and be exposed to the outside. A diametral surface of the dial 205 may be supported by the first bracket 254. Accordingly, when the dial 205 is turned, the heat sink 253 may pivot relative to the second bracket 255. Meanwhile, a protrusion 205*a* may protrude from the arcuate surface of the dial 205.

Referring to FIG. 11, the dial 205, the connecting shaft A, the first bracket 254, and the heat sink 253 may pivot about an axis parallel to the connecting shaft A. Referring to an upper drawing of FIG. 11, the front part 2531 to which the antenna units 251 and 252 (see FIG. 10) are mounted may face forward. Referring to a lower drawing of FIG. 11, when a user turns the dial 205 backward, the front part 2531 may be tilted upward. Conversely, when a user turns the dial 205 forward, the front part 2531 may face forward again.

The connecting shaft A may be positioned between the heat sink 253 and the second bracket 255. The connecting shaft A may be far away from a center of gravity COG of the heat sink 253. According to a tilted angle of the heat sink 253 (see the lower drawing of FIG. 11), torque, defined as the product of a horizontal distance r1 (between the connecting shaft A and the center of gravity COG) and gravity F1, may be applied to the heat sink 253. If the force required for the first bracket 254 to pivot relative to the second bracket 255 is greater than the torque, the heat sink 253 may remain tilted unless a user turns the dial 205.

However, the greater the force required for the first bracket 254 to pivot relative to the second bracket 255, the more difficult it may be for a user to turn the dial 205.

Referring to FIGS. 12 and 13, a cap (205*b*, 205*c*, 205*d*, 205*e*) may be coupled onto the second bracket 255 to be slidable back and forth. A top part 205*b* may cover the dial 205 and the protrusion 205*a*. A bottom part 205*c* may be opposite the top part 205*b*, and may slide on the second bracket 255. A middle part 205*d* may connect the top part 205*b* and the bottom part 205*c*. A groove 205*e* may be formed in the middle part 205*d*, and the protrusion 205*a* may be positioned in the groove 205*e*. An upper end of the protrusion 205*a* may be spaced downward from an upper end of the groove 205*e*. Accordingly, the dial 205 and the protrusion 205*a* may rotate in an arc, and the cap (205*b*, 205*c*, 205*d*, 205*e*) may slide back and forth in response to the rotation of the protrusion 205*a*.

Referring to FIGS. 14 and 15, a communication module 250' may include an antenna unit 251, 252, a heat sink 253', a cooling fan 257', a slider 205', and a bracket 255'.

The heat sink 253' may have the shape of an elongated rectangular prism. A first antenna unit 251 may be coupled to one surface of the heat sink 253'. A second antenna unit 252 may be coupled to the one surface of the heat sink 253' in a manner that is aligned side by side with the first antenna unit 251. A front surface of the antenna unit 251, 252 may face outward, and at least a portion of a rear surface of the antenna unit 251, 252 may be in contact with the heat sink 253'.

In addition, the heat sink 253' may include a first part 253*a*, a second part 253*b*, and a third part 253*c*. The third part 253*c* may define a middle portion of the heat sink 253'. The first part 253*a* may be positioned to the right of the third part 253*c*, and the first antenna unit 251 may be mounted to a front part 253*a*1 of the first part 253*a*. The second part 253*b* may be positioned to the left of the third part 253*c*, and the second antenna unit 252 may be mounted to a front part 253*b*1 of the second part 253*b*.

Moreover, a plurality of first fins 253*a*2, 253*a*3, 253*a*4, and 253*a*5 may protrude rearward from a rear surface of the front part 253*a*1 of the first part 253*a*, and may be spaced apart from each other. A plurality of second fins 253*b*2, 253*b*3, 253*b*4, and 253*b*5 may protrude rearward from a rear surface of the front part 253*b*1 of the second part 253*b*, and may be spaced apart from each other.

The cooling fan 257' may be coupled to a rear surface of the third part 253*c* of the heat sink 253'. The cooling fan 257' may cause a flow of air through the heat sink 253'. The cooling fan 257' may direct air from a rear surface of the cooling fan 257' into a flow path between the first fins 253*a*2, 253*a*3, 253*a*4, and 253*a*5 and into a flow path between the second fins 253*b*2, 253*b*3, 253*b*4, and 253*b*5. Accordingly, the cooling fan 257' may effectively remove heat generated from the antenna units 251 and 252.

A receiving groove 253SL may be formed from an upper side of the third part 253*c* to an inside of the third part 253*c*. A through-hole 253Hc may be formed through a side wall of the third part 253*c* that defines a boundary of the receiving groove 253SL. An upper hole 253Hg may be formed through the side wall of the third part 253*c* that defines the boundary of the receiving groove 253SL. The upper hole 253Hg may be spaced upward from the through-hole 253Hc, and may be spaced forward from the through-hole 253Hc.

The slider 205' may include a body 2051, an arm 2052, 2053, and a head 2055. The body 2051 may extend vertically. The arm 2052, 2053 may protrude from one side surface of the body 2051. A first arm 2052 may protrude to the right from a right side surface of the body 2051. A second arm 2053 may protrude to the left from a left side surface of the body 2051. The head 2055 may be formed at an upper end of the body 2051, and may extend horizontally. A portion of the body 2051 located between the head 2055 and the arm 2052, 2053 may be positioned in the opening 20OP (see FIG. 5), and the head 2055 may slide on the rotating plate 203. A guide hole 2054 may be formed in the body 2051, and may be disposed opposite the head 2055 with respect to the arm 2052, 2053. The guide hole 2054 may extend vertically, and a portion of the guide hole 2054 may be aligned with the upper hole 253Hg.

The bracket 255' may be positioned between the slider 205' and the side wall of the third part 253*c* that defines the boundary of the receiving groove 253SL. The bracket 255' may include a support part 2550 and a side part 2551, 2552.

The support part 2550 may extend horizontally, and may support a lower surface of the arm 2052, 2053. A first rib 2550*a* may protrude upward from a right side of the support part 2550, and the first arm 2052 may slide between the support part 2550 and a bending portion of the first rib 2550*a* along an upper surface of the support part 2550. A second rib 2550*b* may protrude upward from a left side of the support part 2550, and the second arm 2053 may slide between the support part 2550 and a bending portion of the second rib 2550*b* along the upper surface of the support part 2550. A sliding groove 2550G may be formed in the support part 2550, and the body 2051 under the arm 2052, 2053 may be positioned in the sliding groove 2550G.

The side part 2551, 2552 may extend downward from a portion of the support part 2550 that defines a boundary of the sliding groove 2550G. A first side part 2551 may extend downward from a right side of the sliding groove 2550G, and a second side part 2552 may extend downward from a left side of the sliding groove 2550G. A gap 2553 may be formed between the first side part 2551 and the second side part 2552, and the body 2051 under the arm 2052, 2053 may be positioned in the sliding groove 2550G and the gap 2553. Meanwhile, a bridge 2553D may connect a lower end of the first side part 2551 and a lower end of the second side part 2552.

A guide slot 2551*a*, 2552*a* may be formed through the side part 2551, 2552, and may extend in a curved manner. The guide slot 2551*a*, 2552*a* may be positioned between the guide hole 2054 and the upper hole 253Hg. A first guide slot 2551*a* may be formed in the first side part 2551. A second guide slot 2552*a* may be formed in the second side part 2552, and may be disposed opposite the first guide slot 2551*a* with respect to the gap 2553.

A shaft hole 2551*b*, 2552*b* may be formed through the side part 2551, 2552, and may be aligned with the through-hole 253Hc. For example, the shaft hole 2551*b*, 2552*b* may extend vertically, and a width of the shaft hole 2551*b*, 2552*b* may be greater than a diameter of the through-hole 253Hc. As another example, the shaft hole 2551*b*, 2552*b* may be a circular hole of the same size as the through-hole 253Hc. A first shaft hole 2551*b* may be formed in the first side part 2551. A second shaft hole 2552*b* may be formed in the second side part 2552, and may be disposed opposite the first shaft hole 2551*b* with respect to the gap 2553.

A guide pin 256 may extend in the left-and-right direction, and may pass through the upper hole 253Hg, the guide slot 2551*a*, 2552*a*, and the guide hole 2054. A diameter of the guide pin 256 may be substantially equal to a diameter of the upper hole 253Hg, and may be less than a width of the guide hole 2054 and a length of the guide slot 2551*a*, 2552*a*.

A connecting shaft B may extend in the left-and-right direction, and may pass through the through-hole 253Hc and the shaft hole 2551*b*, 2552*b*. The heat sink 253' may rotate about the connecting shaft B relative to the bracket 255'. In addition, the connecting shaft B may include a head Bh and a body Bb.

The head Bh may be caught on a right side wall of the third part 253*c* that defines the boundary of the receiving groove 253SL. The body Bb may extend from the head Bh, and may pass through the right side wall and a left side wall of the third part 253*c* that define the boundary of the receiving groove 253SL. A fastening member Nb such as a nut may be fastened to an outer circumference of the body Bb passing through the left side wall of the third part 253*c*. A washer Wb may be disposed between the left side wall of the third part 253*c* and the fastening member Nb and between the side wall of the third part 253*c* and the side part 2551, 2552, and may be penetrated by the body Bb. For example, the washer Wb may be a disc spring that can generate an elastic force in an axial direction. Accordingly, as the fastening member Nb is more strongly (or firmly) fastened to the body Bb (i.e., as the fastening member Nb fastened to the body Bb is closer to the left side wall of the third part 253*c*), a frictional force between the side wall of the third part 253*c* and the washer Wb (or a frictional force between the side wall of the third part 253*c* and the side part 2551, 2552) increases, thereby requiring more force for the heat sink 253' to pivot relative to the bracket 255'.

Referring to FIGS. 16 to 18, the bracket 255' may be positioned under the rotating plate 203, and may be coupled to the rotating plate 203 via a fastening member F' such as a screw. The body 2051 of the slider 205' may pass through an opening 203G of the rotating plate 203, and the head 2055 of the slider 205' may be positioned above the rotating plate 203.

The heat sink 253' may rotate about the connecting shaft A relative to the bracket 255' fixed to the rotating plate 203. Referring to an upper drawing of FIG. 16, the front parts 253*a*1 and 253*b*1 to which the antenna units 251 and 252 (see FIG. 14) are mounted may face forward. Referring to a lower drawing of FIG. 16, when a user pushes the slider 205' backward, the front parts 253*a*1 and 253*b*1 may be tilted upward. Conversely, when a user pushes the slider 205' forward, the front parts 253*a*1 and 253*b*1 may face forward again.

The connecting shaft B may provide a rotational center axis (the axis of rotation) for the heat sink 253', and may be located on or adjacent to a horizontal line passing through a center of gravity COG of the heat sink 253'. Even when the heat sink 253' is tilted (see the lower drawing of FIG. 16), the connecting shaft B coincides with the horizontal line passing through the center of gravity COG or a horizontal distance between the connecting shaft B and the horizontal line passing through the center of gravity COG is small, thereby minimizing the torque applied to the heat sink 253'. Accordingly, even if the force required for the heat sink 253' to rotate relative to the bracket 255' is set sufficiently small using the fastening member Nb, the heat sink 253 may remain tilted unless a user pushes the slider 205'. In addition, a user may use less force to push the slider 205'.

For example, the shaft hole 2551*b*, 2552*b* may extend vertically, and a width of the shaft hole 2551*b*, 2552*b* may be greater than a diameter of the body Bb of the connecting shaft B. That is, the connecting shaft B may move vertically along the shaft hole 2551*b*, 2552*b*. In this case, the guide slot 2551*a*, 2552*a* may extend along a center line ALr. Here, the center line ALr may be offset upward from a reference line ALc extending in an arc with a certain radius with respect to the center of the through-hole 253Hc (see FIG. 14) into which the body Bb of the connecting shaft B is inserted (see a gap Dc between the reference line ALc and the center line ALr of FIG. 16). The gap Dc may correspond to a distance from the center of the body Bb when the body Bb contacts a lower end of the shaft hole 2551*b*, 2552*b*, and a distance from the center of the body Bb when the body Bb contacts an upper end of the shaft hole 2551*b*, 2552*b*.

Accordingly, when a user pushes the slider 205' backward, the guide pin 256 may move upward while moving along the guide slots 2551*a* and 2552*a*. At the same time, the heat sink 253' may be rotated about the connecting shaft B ascending along the shaft hole 2551*b*, 2552*b*. In this case, as the heat sink 253' rotates while slightly moving up, an edge of the heat sink 253' may not contact an upper surface of the third plate 230.

As another example, the shaft hole 2551*b*, 2552*b* may have the same diameter as the through-hole 253Hc (see FIG. 14) into which the body Bb of the connecting shaft B is inserted. That is, the connecting shaft B may be fixed in position. In this case, the guide slot 2551*a*, 2552*a* may extend along a center line. Here, the center line may be a reference line ALc extending in an arc with a certain radius with respect to the center of the through-hole 253Hc (see FIG. 14) into which the body Bb of the connecting shaft B is inserted.

Accordingly, when a user pushes the slider 205' backward, the guide pin 256 may move along the guide slot 2551*a*, 2552*a*. At the same time, the heat sink 253' may be rotated about the connecting shaft B positioned in place. In this case, since the heat sink 253' rotates in place, the position of the connecting shaft B needs to be determined so that an edge of the heat sink 253' does not contact an upper surface of the third plate 230 (e.g., is positioned slightly behind the center of gravity).

Referring to FIGS. 19 and 20, the communication module 250' may further include a link 256'. The link 256' may be positioned in the sliding groove 2550G and the gap 2553. The link 256' may take the form of a generally L-shaped bar. The link 256' may include a link body 2560, an upper part 2561, a lower part 2562, a first pin hole 256P1, and a second pin hole 256P2.

The link body 2560 may be elongated. The upper part 2561 may be bent from one end (or a first end) of the link body 2560 toward the body 2051 of the slider 205'. The lower part 2562 may be formed at the other end (or a second end) of the link body 2560.

The first pin hole 256P1 may be formed through the upper part 2561. A first pin P1 may be formed in the body 2051, and may be inserted into the first pin hole 256P1. The link 256' may pivot about the first pin P1.

The second pin hole 256P2 may be formed through the lower part 2562. A second pin P2 may pass through the side wall of the third part 253*c* (that defines the boundary of the receiving groove 253SL) and the second pin hole 256P2. The link 256' may pivot about the second pin P2.

Referring to FIG. 21, the second pin P2 may be spaced rearward from the connecting shaft B, and may be spaced upward from the connecting shaft B. The second pin P2 may be adjacent to one corner of the third part 253*c* of the heat sink 253'. For example, the second pin hole 256P2 may extend in a longitudinal direction of the link body 2560, and a width of the second pin hole 256P2 may be greater than a diameter of the second pin P2. That is, the second pin hole 256P2 may move up and down with respect to the second pin P2. Referring to an upper drawing of FIG. 21, when the front parts 253*a*1 and 253*b*1 to which the antenna units 251 and 252 (see FIG. 19) are mounted face forward, the second pin P2 may contact a lower end of the second pin hole 256P2. Referring to a lower drawing of FIG. 21, when the front parts 253*a*1 and 253*b*1 to which the antenna units 251 and 252 (see FIG. 19) are mounted are tilted upward, the second pin P2 may contact an upper end of the second pin hole 256P2.

Accordingly, the link 256' may stably support the heat sink 253' (see the lower drawing of FIG. 21) tilted behind the connecting shaft B.

Referring to FIGS. 22 and 23, a communication module 250" may include an antenna unit 251, 252, a heat sink 253", a cooling fan 257", a slider 205", and a bracket 255".

The heat sink 253" may have the shape of an elongated rectangular prism. A first antenna unit 251 may be coupled to one surface of the heat sink 253". A second antenna unit 252 may be coupled to the one surface of the heat sink 253" in a manner that is aligned side by side with the first antenna unit 251. A front surface of the antenna unit 251, 252 may face outward, and at least a portion of a rear surface of the antenna unit 251, 252 may be in contact with the heat sink 253".

In addition, the heat sink 253" may include a first part 253*d*, a second part 253*e*, and a third part 253*f*. The third part 253*f* may define a middle portion of the heat sink 253". The first part 253*d* may be positioned to the right of the third part 253*f*, and the first antenna unit 251 may be mounted to a front part 253*d*1 of the first part 253*d*. The second part 253*e* may be positioned to the left of the third part 253*f*, and the second antenna unit 252 may be mounted to a front part 253*e*1 of the second part 253*e*.

Moreover, a plurality of first fins 253*d*2, 253*d*3, 253*d*4, and 253*d*5 may protrude rearward from a rear surface of the front part 253*d*1 of the first part 253*d*, and may be spaced apart from each other. A plurality of second fins 253*e*2, 253*e*3, 253*e*4, and 253*e*5 may protrude rearward from a rear surface of the front part 253*e*1 of the second part 253*e*, and may be spaced apart from each other.

The cooling fan 257" may be coupled to a rear surface of the third part 253*f* of the heat sink 253". The cooling fan 257" may cause a flow of air through the heat sink 253". The cooling fan 257" may direct air from a rear surface of the cooling fan 257" into a flow path between the first fins 253*d*2, 253*d*3, 253*d*4, and 253*d*5 and into a flow path between the second fins 253*e*2, 253*e*3, 253*e*4, and 253*e*5. Accordingly, the cooling fan 257" may effectively remove heat generated from the antenna units 251 and 252.

A receiving groove 253TL may be formed from a front surface of the third part 253*f* to an inside of the third part 253*f*. A through-hole 253Hf may be formed through a side wall of the third part 253*f* that defines a boundary of the receiving groove 253TL. A seating portion 253SG may protrude toward the receiving groove 253TL from the side wall of the third part 253*f* that defines the boundary of the receiving groove 253TL. The seating portion 253SG may connect right and left side walls of the third part 253*f*. The seating portion 253SG may be positioned above the through-hole 253Hf.

The slider 205" may include a body 2056, an arm 2056*a*, 2056*b*, a cam 2057, an elastic member 2058, and a head 2056H.

The body 2056 may extend vertically. The arm 2056*a*, 2056*b* may protrude from one side surface of the body 2056. A first arm 2056*a* may protrude to the right from a right side surface of the body 2056. A second arm 2056*b* may protrude to the left from a left side surface of the body 2056.

The cam 2057 may be disposed between the body 2056 and the seating portion 253SG, and may be seated on the seating portion 253SG. The elastic member 2058 may be disposed between the body 2056 and the cam 2057. An upper portion of the elastic member 2058 may be inserted into a groove 2056*h* formed in a lower surface of the body 2056, and a lower portion of the elastic member 2058 may be inserted into an upper portion 2057*a* of the cam 2057. The elastic member 2058 may be a spring that is stretchable in the vertical direction.

The head 2056H may extend horizontally. The head 2056H may be coupled to an upper end of the body 2056 or may be formed as one body with the body 2056. A portion of the body 2056 located between the head 2056H and the arm 2056*a*, 2056*b* may be positioned in the opening 203OP (see FIG. 5), and the head 2056H may slide on the rotating plate 203.

The bracket 255" may be positioned between the cam 2057 and the side wall of the third part 253*f* that defines the boundary of the receiving groove 253TL. The bracket 255" may include a support part 2556 and a side part 2557, 2558.

The support part 2556 may extend horizontally, and may support a lower surface of the arm 2056*a*, 2056*b*. A first rib 2556*a* may protrude upward from a right side of the support part 2556, and the first arm 2056*a* may slide between the support part 2556 and a bending portion of the first rib 2556*a* along an upper surface of the support part 2556. A second rib 2556*b* may protrude upward from a left side of the support part 2556, and the second arm 2056*b* may slide between the support part 2556 and a bending portion of the second rib 2556*b* along the upper surface the support part 2556. A sliding groove 2556G may be formed in the support part 2556, and the elastic member 2058 and the cam 2057 may be positioned in the sliding groove 2556G.

The side part 2557, 2558 may extend downward from a portion of the support part 2556 that defines a boundary of the sliding groove 2556G. A first side part 2557 may extend downward from a right side of the sliding groove 2556G, and a second side part 2558 may extend downward from a left side of the sliding groove 2556G. A gap 2559 may be formed between the first side part 2557 and the second side part 2558, and the cam 2057 may be positioned in the gap 2559. Meanwhile, a bridge 2559D may connect a lower end of the first side part 2557 and a lower end of the second side part 2558.

A shaft hole 2557*c*, 2558*c* may be formed through the side part 2557, 2558, and may be aligned with the through-hole 253Hf. The shaft hole 2557*c*, 2558*c* may be a circular hole of the same size as the through-hole 253Hf. A first shaft hole 2557*c* may be formed in the first side part 2557. A second shaft hole 2558*c* may be formed in the second side part 2558, and may be disposed opposite the first shaft hole 2557*c* with respect to the gap 2559.

A connecting shaft C may extend in the left-and-right direction, and may pass through the through-hole 253Hf and the shaft hole 2557*c*, 2558*c*. The heat sink 253" may rotate about the connecting shaft C relative to the bracket 255". In addition, the connecting shaft C may include a head Ch and a body Cb.

The head Ch may be caught on a right side wall of the third part 253*f* that defines the boundary of the receiving groove 253TL. The body Cb may extend from the head Ch, and may pass through the right side wall and a left side wall of the third part 253*f* that define the boundary of the receiving groove 253TL. A fastening member Nc such as a nut may be fastened to an outer circumference of the body Cb passing through the left side wall of the third part 253*f*.

A washer Wc may be disposed between the left side wall of the third part 253*f* and the fastening member Nc and between the side wall of the third part 253*f* and the side part 2557, 2558, and may be penetrated by the body Cb. For example, the washer Wc may be a disc spring that can generate an elastic force in an axial direction. Accordingly, as the fastening member Nc is more strongly (or firmly) fastened to the body Cb (i.e., as the fastening member Nc fastened to the body Cb is closer to the left side wall of the third part 253*f*), a frictional force between the side wall of the third part 253*f* and the washer Wc (or a frictional force between the side wall of the third part 253*f* and the side part 2557, 2558) increases, thereby requiring more force for the heat sink 253" to rotate relative to the bracket 253".

Referring to FIG. 24, the bracket 255" may be positioned under the rotating plate 203 (see FIG. 17), and may be coupled to the rotating plate 203 via a fastening member F" such as a screw. The body 2056 of the slider 205" may pass through the opening 203G (see FIG. 17) of the rotating plate 203 (see FIG. 17), and the head 2056H of the slider 205" may be positioned above the rotating plate 203.

The cam 2057 may be spaced apart from the connecting shaft C. In other words, the position of the cam 2057 and the position of the connecting shaft C may be different with respect to a longitudinal section of the heat sink 253".

In addition, the cam 2057 may have a curved lower side, and an upper surface of the seating portion 253SG may be curved to correspond to the lower side of the cam 2057. The elastic member 2058 may push the cam 2057 toward the seating portion 253SG.

Referring to an upper drawing of FIG. 24, the front parts 253*d*1 and 253*e*1 to which the antenna units 251 and 252 (see FIG. 22) are mounted may face forward. The cam 2057 may be spaced leftward and upward from the connecting shaft C. The elastic member 2058 may be in a compressed state, and may be seated on the seating portion 253SG.

Referring to a lower picture of FIG. 24, when a user pushes the slider 205" backward, the front parts 253*d*1 and 253*e*1 may be tilted upward. The cam 2057 may be spaced rightward and upward from the connecting shaft C. The elastic member 2058 may transition from the compressed state to its original state (or a slightly compressed state), and the elastic force of the elastic member 2058 may allow the cam 2057 to push the seating portion 253SG. Accordingly, the heat sink 253" may rotate about the connecting shaft C relative to the bracket 255" fixed to the rotating plate 203. Conversely, when a user pushes the slider 205" forward, the front parts 253*d*1 and 253*e*1 may face forward again.

The connecting shaft C may provide a rotational center axis (the axis of rotation) for the heat sink 253", and may be located on or adjacent to a horizontal line passing through a center of gravity COG of the heat sink 253". Even when the heat sink 253" is tilted (see the lower drawing of FIG. 24), the connecting shaft C coincides with the horizontal line passing through the center of gravity COG or a horizontal distance r1" between the connecting shaft C and the horizontal line passing through the center of gravity COG is small, thereby minimizing the torque applied to the heat sink 253". Accordingly, even if the force required for the heat sink 253" to move relative to the bracket 255" is set sufficiently small using the fastening member Nc, the heat sink 253" may remain tilted unless a user pushes the slider 205". In addition, a user may use less force to push the slider 205".

Referring to FIGS. 25 and 26, a communication module 250"' may include an antenna unit 251, 252, a heat sink 253"', a cooling fan 257"', a slider 205"', and a bracket 255"'.

The heat sink 253"' may have the shape of an elongated rectangular prism. A first antenna unit 251 may be coupled to one surface of the heat sink 253"'. A second antenna unit 252 may be coupled to the one surface of the heat sink 253"' in a manner that is aligned side by side with the first antenna unit 251. A front surface of the antenna unit 251, 252 may face outward, and at least a portion of a rear surface of the antenna unit 251, 252 may be in contact with the heat sink 253"'.

In addition, the heat sink 253"' may include a first part 253*g*, a second part 253*h*, and a third part 253*i*. The third part 253*i* may define a middle portion of the heat sink 253"'. The first part 253*g* may be positioned to the right of the third part 253*i*, and the first antenna unit 251 may be mounted to a front part 253*g*1 of the first part 253*g*. The second part 253*h* may be positioned to the left of the third part 253*i*, and the second antenna unit 252 may be mounted to a front part 253*h*1 of the second part 253*h*.

Moreover, a plurality of first fins 253*g*2, 253*g*3, 253*g*4, and 253*g*5 may protrude rearward from a rear surface of the front part 253*g*1 of the first part 253*g*, and may be spaced apart from each other. A plurality of second fins 253*h*2, 253*h*3, 253*h*4, and 253*h*5 may protrude rearward from a rear surface of the front part 253*h*1 of the second part 253*h*, and may be spaced apart from each other.

The cooling fan 257"' may be coupled to a rear surface of the third part 253*i* of the heat sink 253"'. The cooling fan 257"' may cause a flow of air through the heat sink 253"'. The cooling fan 257"' may direct air from a rear surface of the cooling fan 257"' into a flow path between the first fins 253*g*2, 253*g*3, 253*g*4, and 253*g*5 and into a flow path between the second fins 253*h*2, 253*h*3, 253*h*4, and 253*h*5. Accordingly, the cooling fan 257"' may effectively remove heat generated from the antenna units 251 and 252.

A receiving groove 253UL may be formed from a front surface of the third part 253*i* to an inside of the third part 253*i*. A through-hole 253Hi may be formed through a side wall of the third part 253*i* that defines a boundary of the receiving groove 253UL.

The slider 205"' may include a body 2059, an arm 2059*a*, 2059*b*, a rack 2059R, and a head 2059H.

The body 2059 may extend vertically. The arm 2059*a*, 2059*b* may protrude from one side surface of the body 2059. A first arm 2059*a* may protrude to the right from a right side surface of the body 2059. A second arm 2059*b* may protrude to the left from a left side surface of the body 2059.

The rack 2059R may be formed on a lower side of the body 2059, and may extend in the front-and-rear direction. The rack 2059R may be formed on at least a portion of the lower side of the body 2059.

A pinion 258' may be positioned under the rack 2059R. A pinion body 2580' may have a generally fan shape, and a pinion gear 258R' may be formed on an outer circumferential surface of the pinion body 2580', and may engage with the rack 2059. A fixing hole 2581*h*' may be formed in the pinion body 2580', and may be aligned with the through-hole 253Hi. The fixing hole 2581*h*' may be an angled hole.

The head 2059H may extend horizontally. The head 2059H may be coupled to an upper end of the body 2059 or may be formed as one body with the body 2059. A portion of the body 2059 located between the head 2059H and the arm 2059*a*, 2059*b* may be positioned in the opening 203OP (see FIG. 5), and the head 2059H may slide on the rotating plate 203.

The bracket 255"' may be positioned between the pinion 258' and the side wall of the third part 253*i* that defines the boundary of the receiving groove 253UL. The bracket 255''' may include a support part 2556' and a side part 2557', 2558'.

The support part 2556' may extend horizontally, and may support a lower surface of the arm 2059*a*, 2059*b*. A first rib 2556*a*' may protrude upward from a right side of the support part 2556', and the first arm 2059*a* may slide between the support part 2556' and a bending portion of the first rib 2556*a*' along an upper surface of the support part 2556'. A second rib 2556*b*' may protrude upward from a left side of the support part 2556', and the second arm 2059*b* may slide between the support part 2556' and a bending portion of the second rib 2556*b*' along the upper surface of the support part 2556'. A sliding groove 2556G' may be formed in the support part 2556', and the body 2059 under the arm 2059*a*, 2059*b* and the pinion 258' may be positioned in the sliding groove 2556G'.

The side part 2557', 2558' may extend downward from a portion of the support part 2556' that defines a boundary of the sliding groove 2556G'. A first side part 2557' may extend downward from a right side of the sliding groove 2556G', and a second side part 2558' may extend downward from a left side of the sliding groove 2556G'. A gap 2559' may be formed between the first side part 2557' and the second side part 2558', and the pinion 258' may be positioned in the gap 2559'. Meanwhile, a bridge 2559D' may connect a lower end of the first side part 2557' and a lower end of the second side part 2558'.

A shaft hole 2557*c*', 2558*c*' may be formed through the side part 2557', 2558', and may be aligned with the through-hole 253Hi. The shaft hole 2557*c*', 2558*c*' may be a circular hole of the same size as the through-hole 253Hi. A first shaft hole 2557*c*' may be formed in the first side part 2557'. A second shaft hole 2558*c*' may be formed in the second side part 2558', and may be disposed opposite the first shaft hole 2557*c*' with respect to the gap 2559'.

A connecting shaft D may extend in the left-and-right direction, and may pass through the through-hole 253Hi, the shaft hole 2557*c*', 2558*c*', and the fixing hole 2581*h*'. The heat sink 253''' may rotate about the connecting shaft D relative to the bracket 255'''. A portion Dc of the connecting shaft D may be angled, and may be inserted into the angled fixing hole 2581*h*' and the angled through-hole 253Hi. That is, the pinion 258', the connecting shaft D, and heat sink 253''' may be rotated together. In addition, the connecting shaft D may include a head Dh and a body Db.

The head Dh may be caught on a right side wall of the third part 253*i* that defines the boundary of the receiving groove 253UL. The body Db may extend from the head Dh, and may pass through the right side wall and a left side wall of the third part 253*i* that define the boundary of the receiving groove 253UL. A fastening member Nd such as a nut may be fastened to an outer circumference of the body Db passing through the left side wall of the third part 253*i*. A washer Wd may be disposed between the left side wall of the third part 253*i* and the fastening member Nd and between the side wall of the third part 253*f* and the side part 2557', 2558', and may be penetrated by the body Db. For example, the washer Wd may be a disc spring that can generate an elastic force in an axial direction. Accordingly, as the fastening member Nd is more strongly (or firmly) fastened to the body Db (i.e., as the fastening member Nd fastened to the body Db is closer to the left side wall of the third part 253*i*), a frictional force between the side wall of the third part 253*i* and the washer Wd (or a frictional force between the side wall of the third part 253*i* and the side part 2557', 2558') increases, thereby requiring more force for the heat sink 253''' to rotate relative to the bracket 255'''.

Referring to FIG. 27, the bracket 255''' may be positioned under the rotating plate 203 (see FIG. 17), and may be coupled to the rotating plate 203 via a fastening member F''' such as a screw. The body 2059 of the slider 205''' may pass through the opening 203G (see FIG. 17) of the rotating plate 203 (see FIG. 17), and the head 2059H of the slider 205''' may be positioned above the rotating plate 203.

The pinion gear 258R' may be engaged with the rack 2059R under the rack 2059R. The pinion gear 258R' may be a spur gear. In response to the back-and-forth movement of the rack 2059R, the pinion 258' may rotate about the connecting shaft D parallel to the left-and-right direction. When the rack 2059R moves backward, the pinion 258' engaged with the rack 2059R may be rotated clockwise. When the rack 2059R moves forward, the pinion 258' engaged with the rack 2059R may rotate counterclockwise.

Referring to an upper drawing of FIG. 27, the front parts 253*g*1 and 253*h*1 to which the antenna units 251 and 252 (see FIG. 26) are mounted may face forward. The pinion gear 258R' may engage with a portion adjacent to a rear end of the rack 2059R.

Referring to a lower drawing of FIG. 27, when a user pushes the slider 205''' backward, the front parts 253*g*1 and 253*h*1 may be tilted upward. The pinion gear 258R' may engage with a portion adjacent to a front end of the rack 2059R. Accordingly, the heat sink 253''' may rotate about the connecting shaft D relative to the bracket 255''' fixed to the rotating plate 203. Conversely, when a user pushes the slider 205''' forward, the front parts 253*g*1 and 253*h*1 may face forward again.

The connecting shaft D may provide a rotational center axis (the axis of rotation) for the heat sink 253''', and may be located on or adjacent to a horizontal line passing through a center of gravity COG of the heat sink 253'''. Even when the heat sink 253''' is tilted (see the lower drawing of FIG. 27), the connecting shaft D coincides with the horizontal line passing through the center of gravity COG or a horizontal distance r1''' between the connecting shaft D and the horizontal line passing through the center of gravity COG is small, thereby minimizing the torque applied to the heat sink 253'''. Accordingly, even if the force required for the heat sink 253''' to rotate relative to the bracket 255''' is set sufficiently small using the fastening member Nd, the heat sink 253''' may remain tilted unless a user push the slider 205'''. In addition, a user may use less force to push the slider 205'''.

Referring to FIGS. 28 and 29, the rotating plate 203 may include a first part 2032, a second part 2033, and a third part 2034. The first part 2032 may be coupled onto the second bracket 255 (see FIG. 9). The second part 2033 may be coupled to an edge of the first part 2032. The third part 2034 may be coupled onto the first part 2032, and may have a circular plate shape.

A rotating column 2031 may protrude from a lower surface of the first part 2032 toward the rotation support 233 (see FIG. 8). The rotating column 2031 may be fixed to the rotating shaft 235 (see FIG. 8), and may rotate on the rotation support 233 (see FIG. 8). The communication module 250 may be positioned between the rotating plate 203 and the third plate 230, and may rotate together with the rotating plate 203. In addition, the antenna units 251 and 252 may pivot together with the dial 205. Accordingly, the antenna units 251 and 252 may rotate left and right and may pivot up and down. For example, the antenna units 251 and 252 may rotate left and right within a range of 180 degrees, and may pivot up and down within a range of 50 to 90 degrees. Meanwhile, the communication module 250 may be located between an axis of rotation Ax of the rotating plate 203 and an outer circumference of the rotating plate 203.

Referring to FIG. 30, the fan 240 may include a housing 242, an inlet 243, and an outlet 244. For example, the fan 240 may be a Sirocco fan. A buffer member 241 may be disposed between the third plate 230 and the housing 242. The buffer member 241 may have a hole 241V corresponding to the inlet 243, and the third plate 230 may have an opening 230V corresponding to the hole 241V.

When the fan 240 operates, air may pass through the opening 230V of the third plate 230, the hole 241V of the buffer member 241, the inlet 243, and the outlet 244. Accordingly, the fan 240 may remove heat generated under the third plate 230.

Referring to FIGS. 31 and 32, a power supply unit PSU may be mounted on the first plate 210 between the first plate 210 and the second plate 220. The power supply unit PSU may be disposed closer to the first plate 210 than to the second plate 220. Accordingly, heat generated from the power supply unit PSU may be transferred to the first plate 210 and may be removed by air passing between the power supply unit PSU and the second plate 220.

A main board MB may be mounted on the second plate 220 between the second plate 220 and the third plate 230. The main board MB may be disposed closer to the second plate 220 than to the third plate 230. The amount of heat generated from the main board MB may be greater than the amount of heat generated from the power supply unit PSU. When the fan 240 operates, air introduced into the case 201 from the outside of the case 201 through the first inlet hole 202, the second inlet hole 204 (see FIG. 6), and/or the third inlet hole 208 may discharge heat generated from the power supply unit PSU and/or the main board MB to the outside through the fan 240 and the outlet hole 206. In addition, air may pass through the heat sink 253 by the cooling fan 257 and then may be discharged to the outside through the fan 240 and the outlet hole 206.

Referring to FIGS. 33 and 34, the communication module 250 of the control box 200 may wirelessly communicate with a communication module 390 of the head 300. In response to the position of the control box 200 with respect to the communication module 390 of the head 300, the rotating plate 203 may be rotated left and right or pivoted (tilted) up and down. Thus, it is possible to increase an antenna transmission and reception rate between the communication module 250 of the control box 200 and the communication module 390 of the head 300.

Referring to FIGS. 1 to 34, a control box according to an aspect of the present disclosure may include: a case; a bracket disposed inside the case and coupled to the case; and a communication module rotatably coupled to the bracket, wherein the communication module may include: an antenna unit; a heat sink to which the antenna unit is mounted and which is elongated, the heat sink overlapping a portion of the bracket in a longitudinal direction of the heat sink; and a connecting shaft extending in the longitudinal direction of the heat sink and connecting the heat sink and the bracket, wherein the connecting shaft may provide an axis of rotation for the communication module.

The connecting shaft may be located on or adjacent to a straight line which passes through a center of gravity of the heat sink and which extends in the longitudinal direction of the heat sink.

The control box may further include: a fastening member coupled to the connecting shaft adjacent to one end of the connecting shaft; and a washer disposed between the fastening member and one side of the heat sink.

The fastening member may be screw-coupled to the connecting shaft.

The washer may include a disc spring that provides an elastic force in an axial direction of the connecting shaft.

The communication module may further include a slider extending in a direction which intersects the longitudinal direction of the heat sink, the slider rotating the heat sink while moving in a direction which intersects the longitudinal direction of the heat sink and a longitudinal direction of the slider, wherein a portion of the slider may be positioned outside the heat sink.

The heat sink may include: a receiving groove in which the portion of the bracket is positioned; and a through-hole formed at a portion of the heat sink which defines a boundary of the receiving groove, wherein the bracket may include a shaft hole aligned with the through-hole, wherein the connecting shaft may pass through the through-hole and the shaft hole.

The bracket may include an arc-shaped guide slot spaced apart from the shaft hole, wherein the slider may include a guide hole extending in the longitudinal direction of the slider, wherein the heat sink may include a guide pin extending in the longitudinal direction of the heat sink, passing through the guide slot and the guide hole, and fixed to the heat sink.

The shaft hole may have a shape corresponding to an outer circumference of the connecting shaft, wherein the guide slot may extend in an arc with a certain radius with respect to the connecting shaft.

The shaft hole may have a width greater than a diameter of the connecting shaft in the longitudinal direction of the slider, wherein the guide slot may be offset in a width direction of the shaft hole from an arc having a certain radius with respect to the connecting shaft.

The control box may further include a link which is positioned in the receiving groove, and which has one end pivotably coupled to the slider and the other end pivotably coupled to the heat sink, wherein the other end of the link may be adjacent to one corner of the heat sink.

The slider may include: a body extending in the longitudinal direction of the slider; a cam disposed opposite the body and having one curved side; and an elastic member which is disposed between the body and the cam, and which is stretchable in the longitudinal direction of the slider, wherein the heat sink may include a seating portion protruding toward the receiving groove from the portion of the heat sink which defines the boundary of the receiving groove, wherein the one side of the cam may be seated on the seating portion, and the cam may be spaced apart from the connecting shaft.

The slider may include: a pinion positioned in the receiving groove, the pinion including a pinion gear formed on an outer circumferential surface of the pinion and a fixing hole aligned with the shaft hole; and a body facing the pinion, the body including a rack extending in a movement direction of the slider and engaged with the pinion gear, wherein the connecting shaft may pass through the fixing hole and may be fixed to the fixing hole.

The bracket may further include: a support part extending in a movement direction of the slider, the support part including a sliding groove extending in the movement direction of the slider; and a side part extending from a boundary of the sliding groove in a direction intersecting the support part, positioned in the receiving groove, and in which the shaft hole is formed, wherein the slider may further include: a body extending in the longitudinal direction of the slider and passing through the sliding groove; and an arm protruding from a side surface of the body, the arm being seated on the support part.

The control box may further include a cooling fan mounted to the heat sink.

The heat sink may include a plurality of fins spaced apart from each other to form a flow path for air moved by the cooling fan.

The case may include an opening formed at one surface of the case, wherein the control box may further include a rotating plate which covers the opening, which is rotatable about an axis perpendicular to the one surface of the case, wherein the bracket may be coupled to the rotating plate.

A display device according to another aspect of the present disclosure may include: a head including a display panel; and a control box communicating with the head.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the present disclosure should be determined by reasonable interpretation of the appended claims, and all changes coming within the equivalency range of the present disclosure are intended to be embraced in the scope of the present disclosure.

The invention claimed is:

1. A control box comprising:
- a case;
- a bracket disposed inside the case and coupled to the case; and
- a communication module rotatably coupled to the bracket,
- wherein the communication module comprises:
- an antenna unit;
- a heat sink to which the antenna unit is mounted and which is elongated, the heat sink overlapping a portion of the bracket in a longitudinal direction of the heat sink;
- a connecting shaft extending in the longitudinal direction of the heat sink, connecting the heat sink and the bracket, and providing an axis of rotation for the communication module; and
- a slider extending in a direction which intersects the longitudinal direction of the heat sink and including a portion which is positioned outside the heat sink, the slider rotating the heat sink while moving in a direction which intersects the longitudinal direction of the heat sink and a longitudinal direction of the slider,
- wherein the slider comprises:
- a body extending in the longitudinal direction of the slider;
- a cam disposed opposite the body and having one curved side; and
- an elastic member which is disposed between the body and the cam, and which is stretchable in the longitudinal direction of the slider,
- wherein the heat sink comprises:
- a receiving groove in which the portion of the bracket is positioned; and
- a seating portion protruding toward the receiving groove from a portion of the heat sink which defines the boundary of the receiving groove,
- wherein the one side of the cam is seated on the seating portion, and
- wherein the cam is spaced apart from the connecting shaft.

2. The control box of claim 1, wherein the connecting shaft is located on or adjacent to a straight line which passes through a center of gravity of the heat sink and which extends in the longitudinal direction of the heat sink.

3. The control box of claim 1, further comprising:
- a fastening member coupled to the connecting shaft adjacent to one end of the connecting shaft; and
- a washer disposed between the fastening member and one side of the heat sink,
- wherein the fastening member is screw-coupled to the connecting shaft.

4. The control box of claim 1, wherein the heat sink comprises
- a through-hole formed at the portion of the heat sink which defines a boundary of the receiving groove,
- wherein the bracket comprises a shaft hole aligned with the through-hole, and
- wherein the connecting shaft passes through the through-hole and the shaft hole.

5. The control box of claim 1, further comprising a cooling fan mounted to the heat sink,
- wherein the heat sink includes a plurality of fins spaced apart from each other to form a flow path for air moved by the cooling fan.

6. The control box of claim 1, wherein the case comprises an opening formed at one surface of the case,
- wherein the control box further comprises a rotating plate which covers the opening, which is rotatable about an axis perpendicular to the one surface of the case, and
- wherein the bracket is coupled to the rotating plate.

7. A display device comprising:
- a head including a display panel; and
- the control box of claim 1 communicating with the head.

8. The control box of claim 4, wherein the bracket comprises an arc-shaped guide slot spaced apart from the shaft hole,
- wherein the slider comprises a guide hole extending in the longitudinal direction of the slider, and
- wherein the heat sink comprises a guide pin extending in the longitudinal direction of the heat sink, passing through the guide slot and the guide hole, and fixed to the heat sink.

9. The control box of claim 4, wherein the slider comprises:
- a pinion positioned in the receiving groove, the pinion including a pinion gear formed on an outer circumferential surface of the pinion and a fixing hole aligned with the shaft hole; and
- a body facing the pinion, the body including a rack extending in a movement direction of the slider and engaged with the pinion gear, and
- wherein the connecting shaft passes through the fixing hole and is fixed to the fixing hole.

10. The control box of claim 4, wherein the bracket further comprises:

a support part extending in a movement direction of the slider, the support part including a sliding groove extending in the movement direction of the slider; and a side part extending from a boundary of the sliding groove in a direction intersecting the support part, positioned in the receiving groove, and in which the shaft hole is formed, and wherein the slider further comprises:

a body extending in the longitudinal direction of the slider and passing through the sliding groove; and an arm protruding from a side surface of the body, the arm being seated on the support part.

11. The control box of claim 8, wherein the shaft hole has a shape corresponding to an outer circumference of the connecting shaft, and wherein the guide slot extends in an arc with a certain radius with respect to the connecting shaft.

12. The control box of claim 8, wherein the shaft hole has a width greater than a diameter of the connecting shaft in the longitudinal direction of the slider, and wherein the guide slot is offset in a width direction of the shaft hole from an arc having a certain radius with respect to the connecting shaft.

13. The control box of claim 8, further comprising a link which is positioned in the receiving groove, and which has one end pivotably coupled to the slider and the other end pivotably coupled to the heat sink, wherein the other end of the link is adjacent to one corner of the heat sink.

* * * * *